United States Patent
Noda et al.

(10) Patent No.: US 11,527,378 B2
(45) Date of Patent: Dec. 13, 2022

(54) CARBON-METAL STRUCTURE AND METHOD FOR MANUFACTURING CARBON-METAL STRUCTURE

(71) Applicants: WASEDA UNIVERSITY, Tokyo (JP); MEIDENSHA CORPORATION, Tokyo (JP)

(72) Inventors: Suguru Noda, Tokyo (JP); Sae Kitagawa, Tokyo (JP); Kotaro Yasui, Tokyo (JP); Hisashi Sugime, Tokyo (JP); Daizo Takahashi, Numadu (JP); Yuichi Nishikiori, Numadu (JP); Hayato Ochi, Numadu (JP); Rena Takahashi, Numadu (JP); Toshimasa Fukai, Shizuoka (JP)

(73) Assignees: WASEDA UNIVERSITY, Tokyo (JP); MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 17/288,084

(22) PCT Filed: Oct. 21, 2019

(86) PCT No.: PCT/JP2019/041284
§ 371 (c)(1),
(2) Date: Apr. 23, 2021

(87) PCT Pub. No.: WO2020/085291
PCT Pub. Date: Apr. 30, 2020

(65) Prior Publication Data
US 2021/0375572 A1 Dec. 2, 2021

(30) Foreign Application Priority Data

Oct. 26, 2018 (JP) .............................. JP2018-201613

(51) Int. Cl.
*H01J 9/02* (2006.01)
*H01J 1/304* (2006.01)
(Continued)

(52) U.S. Cl.
CPC .............. *H01J 9/025* (2013.01); *H01J 1/304* (2013.01); *H01J 35/065* (2013.01); *B82Y 40/00* (2013.01);
(Continued)

(58) Field of Classification Search
CPC .......... H01J 9/025; H01J 1/304; H01J 35/065; H01J 2201/30419; H01J 2201/30469;
(Continued)

(56) References Cited

U.S. PATENT DOCUMENTS

2001/0019601 A1* 9/2001 Tkahashi ............... B82Y 10/00
378/114
2004/0195950 A1* 10/2004 Ryu ........................ H01J 9/025
313/497

(Continued)

FOREIGN PATENT DOCUMENTS

JP 2001-250496 A 9/2001
JP 2003-59391 A 2/2003
(Continued)

OTHER PUBLICATIONS

Yosuke Shiratori et al., Field Emission Properties of Single-Walled Carbon Nanotubes with a Variety of Emitter Morphologies, The Japan Society of Applied Physics, Japanese Journal of Applied Physics, vol. 47, No. 6, Jun. 13, 2008, pp. 4780-4787.
(Continued)

*Primary Examiner* — Donald L Raleigh
(74) *Attorney, Agent, or Firm* — Foley & Lardner LLP

(57) ABSTRACT

It is a CNT device (1) (carbon-metal structure) equipped with a carbon nanotube layer (2) (CNT layer 2; same
(Continued)

hereafter) on a metal pedestal (4). The metal pedestal (4) is brazed to the CNT layer (2) with a brazing material layer (3) interposed therebetween. When manufacturing the CNT device (1), firstly, the CNT layer (2) is formed on a heat-resistant textured substrate (6). Next, the metal pedestal (4) is brazed to the CNT layer (2) that is on the heat-resistant textured substrate (6) with the brazing material layer (3) interposed therebetween. Then, the metal pedestal (4) (and the CNT layer 2) is peeled off the heat-resistant textured substrate (6) to transfer the CNT layer (2) from the heat-resistant textured substrate (6) to the metal pedestal (4).

21 Claims, 20 Drawing Sheets

(51) Int. Cl.
*H01J 35/06* (2006.01)
*B82Y 40/00* (2011.01)

(52) U.S. Cl.
CPC ............... *H01J 2201/30419* (2013.01); *H01J 2201/30469* (2013.01); *H01J 2235/062* (2013.01)

(58) Field of Classification Search
CPC ....... H01J 2235/062; H01J 2237/06341; H01J 9/02; H01J 37/073; H01J 35/064; H01J 1/3042; H01J 9/14; B82Y 40/00; B82Y 30/00; H01G 11/26; H01G 11/32
See application file for complete search history.

(56) References Cited

U.S. PATENT DOCUMENTS

2007/0031317 A1* 2/2007 Akamatsu ............ C01B 32/162
423/447.6
2007/0231486 A1 10/2007 Noda

FOREIGN PATENT DOCUMENTS

| JP | 2004-214164 | A | | 7/2004 | |
| JP | 2005-74472 | A | | 3/2005 | |
| JP | 2005074472 | A | * | 3/2005 | ............ H01J 1/304 |
| JP | 2009-245672 | A | | 10/2009 | |
| JP | 2011-119084 | A | | 6/2011 | |
| WO | WO 2005/007571 | A1 | | 7/2005 | |
| WO | WO 2006/011468 | A1 | | 2/2006 | |

OTHER PUBLICATIONS

Sae Kitagawa et al., Carbon-nanotube-copper complex collective morphology control and electron emitter application, Public Interest Incorporated Association "The Society of Chemical Engineers, Japan", Research Presentation Proceedings of Annual Meeting of the Society of Chemical Engineers, Japan, vol. 83, Mar. 13, 2018, PC 254.

* cited by examiner (a)

(b)

(a) CVD 1 min

Thickness 3.5 um (b) CVD 2 min

3.3 um

CARBON-METAL STRUCTURE AND METHOD FOR MANUFACTURING CARBON-METAL STRUCTURE

TECHNICAL FIELD

It relates to a carbon-metal structure and a method for manufacturing the carbon-metal structure. For example, it relates to a device equipped with a carbon film layer containing fine carbon such as carbon nanotube.

BACKGROUND ART

Carbon nanotube (CNT; same hereafter) is applied to various apparatuses (e.g., Patent Publications 1-3). CNT is applied, for example, to cold cathode electron emitter. Cold cathode electron emitter is an electron source that emits electrons to vacuum by an outside electric field and is applied to electron microscopes, X-ray apparatuses, electron beam exposure apparatuses, information display apparatuses, lighting apparatuses, etc. As compared with conventional thermionic emission, cold cathode electron emitter has advantages such as low power consumption, size reduction capability, high response speed, high electron density, etc.

In the case of applying CNT to emitter, it is preferable to have CNT high density portions sparsely arranged on the emitter surface. For example, on the emitter surface, pillars of CNT bundle having a height of about 1 μm to 100 μm are made to have a pillar arrangement of about ½ in the ratio (H/R) of pillar height (H) to pillar spacing (R). With this, it is considered that the number of pillars can be increased without weakening of electric field concentration to one pillar. Thus, in conventional emitters, a paste containing an organic solvent is pattern printed to support CNT there. In case that the paste contains an organic solvent, resistance is also high, thereby resulting in gas emission in vacuum.

In this way, in the field of CNT, the product performance may vary depending on the textured surface of the CNT layer's surface or the CNT dispersion condition on the CNT layer's surface. Thus, there is a proposal of technology in which a catalyst for forming CNT is fixed to a heat-resistant textured substrate that grows CNT, and oriented CNT is grown on this heat-resistant textured substrate, thereby forming on the CNT surface a texture that conforms to the surface configuration of the heat-resistant textured substrate (e.g., Non-patent Publication 1).

In Non-patent Publication 1, CNT is grown on the Si substrate to form a CNT layer. In this method, it is possible to prepare CNT devices by a short time process. Furthermore, it is possible to prepare CNT devices having the same pattern by using the heat-resistant textured substrate as a mold and to make the CNT complex tip shape sharp. On the other hand, Si substrate to grow CNT is high in resistance and cost. Therefore, its application to the product has been difficult. Furthermore, there has been a risk that the Si substrate is broken by clamping and fixing together with the Si substrate when incorporating the Si substrate into the device. Therefore, it has been difficult to fix CNT to the device. Furthermore, in the case of growing CNT on the heat-resistant textured substrate, the textured shape of of the CNT tip portion is affected by the growth of CNT, thereby causing a risk that control of texture becomes difficult.

Thus, there is a proposal of technology in which CNT grown on the Si substrate is peeled and transferred to a copper thin film (e.g., Non-patent Publication 2). With this, there is formed a CNT layer having a textured surface that conforms to the surface configuration of the heat-resistant textured substrate to grow CNT. Furthermore, it is possible to reuse the heat-resistant textured substrate, thereby reducing the cost for producing the CNT device.

PRIOR ART PUBLICATIONS

Patent Publications

Patent Publication 1: JP Patent Application Publication 2009-245672.
Patent Publication 2: International Patent Application Publication 2006/011468.
Patent Publication 3: JP Patent Application Publication 2011-119084.

Non-Patent Publications

Non-patent Publication 1: Yosuke SHIRATORI and seven others, "Field Emission Properties of Single-Walled Carbon Nanotubes with a Variety of Emitter Morphologies", Jun. 13, 2008, The Japan Society of Applied Physics, Japanese Journal of Applied Physics, Volume 47, No. 6, pp. 4780-4787.
Non-patent Publication 2: Sae KITAGAWA and two others, "Carbon-nanotube-copper complex collective configuration control and electron emitter application", Mar. 13, 2018, Public Interest Incorporated Association "The Society of Chemical Engineers, Japan", Research Presentation Proceedings of Annual Meeting of the Society of Chemical Engineers, Japan, Vol. 83, PC 254.

SUMMARY OF THE INVENTION

A CNT/Cu complex film in which a carbon film layer containing fibrous carbon, such as CNT layer, is directly provided with a copper thin film as a collector, is thin in thickness and very difficult in handling when incorporating into the device. That is, the CNT/Cu complex film has a film shape, thereby causing a risk to be bent, lost in flatness or brown away by wind. Therefore, its handling is difficult. Furthermore, when incorporating the CNT/Cu complex film into the device, it is also necessary to have a step of cutting into a necessary size, thereby causing a risk that accompanies an operational difficulty. It is also considered to form a collector having a thickness of a certain degree in CNT/Cu complex film. Forming a collector of a certain degree on the CNT layer, however, results in increase in production cost.

Furthermore, the surface (i.e., surface of collector) of the CNT/Cu complex film to be connected to the device has a texture similar to that of CNT layer. Therefore, there is a risk to damage brazing property between the collector and the device.

The present invention was made in view of the above-mentioned situation, and it is an object to provide a technology that achieves an easy handling of a carbon-metal structure equipped with a carbon film layer containing fibrous carbon.

According to one aspect of a carbon-metal structure of the present invention to achieve the object, there is provided a carbon-metal structure, comprising a carbon film layer containing a fibrous carbon; a brazing material layer that is directly provided on the carbon film layer; and a metal pedestal that is provided on the carbon film layer with the brazing material layer interposed therebetween.

In one aspect of this carbon-metal structure, it is optional that the carbon film layer has on a surface thereof a texture having an average height of 1 μm to 100 μm and a height/spacing ratio of 1/5 to 5/1.

Furthermore, it is optional that the carbon film layer is a layer that is preformed on a substrate, and that the brazing material layer is a layer formed on an end portion of the carbon film layer that is on a side opposite to a surface in contact with the substrate.

Furthermore, it is optional that the brazing material layer is a layer formed of a metal brazing material, and that a mixed layer that is the carbon film layer impregnated with the brazing material that forms the brazing material layer is formed at an interface between the carbon film layer and the brazing material layer.

Furthermore, it is optional that the brazing material layer has a multilayer structure having a first brazing material layer that is formed on a side of the carbon film layer and a second brazing material layer that is formed on a side of the metal pedestal and has a melting point lower than that of the first brazing material layer.

Furthermore, it is optional that the brazing material layer has a thickness of from 1 μm to 50 μm.

Furthermore, an electron emitter of the present invention to achieve the object comprises any of the carbon-metal structures.

Furthermore, an X-ray tube of the present invention to achieve the object comprises the electron emitter.

Furthermore, according to one aspect of a method for manufacturing a carbon-metal structure of the present invention to achieve the object, there is provided a method for manufacturing a carbon-metal structure, comprising the steps of forming on a substrate a carbon film layer containing a fibrous carbon; forming a brazing material layer on the carbon film layer formed on the substrate; brazing a metal pedestal to the carbon film layer with the brazing material layer interposed therebetween; and removing the substrate from the carbon film layer.

In one aspect of this method for manufacturing a carbon-metal structure, it is optional that the brazing material layer contains a metal brazing material that is vapor-deposited on the carbon film layer.

Furthermore, according to another aspect of a method for manufacturing a carbon-metal structure of the present invention to achieve the object, there is provided a method for manufacturing a carbon-metal structure, comprising the steps of forming on a substrate a carbon film layer containing a fibrous carbon; forming a brazing material layer on a metal pedestal that supports the carbon film layer formed on the substrate; brazing a metal pedestal to the carbon film layer with the brazing material layer interposed therebetween; and removing the substrate from the carbon film layer.

Furthermore, it is optional that the brazing material layer has a multilayer structure having a first brazing material layer that is formed on a side of the carbon film layer and a second brazing material layer that is formed on a side of the metal pedestal and has a melting point lower than that of the first brazing material layer.

In each aspect of the method for manufacturing a carbon-metal structure, it is optional that the carbon film layer is formed on the substrate by a chemical vapor deposition.

Furthermore, it is optional that the substrate has on a surface thereof a texture having an average height of 1 μm to 100 μm and a height/spacing ratio of 1/5 to 5/1.

Furthermore, it is optional that the substrate removed from the carbon film layer is reused as a substrate on which a carbon film layer of another carbon-metal structure is formed.

Furthermore, it is optional that a plurality of metal pedestals are brazed to the carbon film layer with the brazing material layer interposed therebetween.

According to the above-mentioned invention, it becomes easy to handle a carbon-metal structure comprising a carbon film layer containing a fibrous carbon. Furthermore, it is possible to provide a carbon-metal structure that is low in outgassing and resistance and high in emission performance.

BRIEF DESCRIPTION OF THE DRAWINGS

FIG. 1 shows explanatory views for explaining an outline of a CNT device according to an embodiment of the present invention, wherein FIG. 1(a) is a side view of the CNT device, and FIG. 1(b) is a sectional view of the CNT device;

FIG. 4(b) shows SEM images of a CNT layer surface of the same CNT device;

FIG. 6 shows views for explaining an outline of a CNT device of Example 2, wherein FIG. 6(a) shows views before brazing, and FIG. 6(b) shows views after brazing;

FIG. 7 shows views for explaining an outline of a CNT device of Example 3, wherein FIG. 7(a) shows views before brazing, and FIG. 7(b) shows views after brazing;

FIG. 15(b) is a characteristic diagram showing electrode characteristics (cycle characteristics) of the CNT devices of Example 5;

FIG. 22(b) is a characteristic view showing electrode characteristics (cycle characteristics) of the same CNT device;

MODE FOR IMPLEMENTING THE INVENTION

A carbon-metal structure and a method for manufacturing the carbon-metal structure according to an embodiment of the present invention, and an electron emitter and an X-ray tube which are equipped with the carbon-metal structure according to the embodiment of the present invention are explained in detail with reference to the drawings. Although, in the explanation of the embodiment, the carbon-metal structure is explained by citing an example applied to an emitter such as X-ray apparatus, the carbon-metal structure is not limited to the embodiment. For example, it can be applied to an apparatus to which fine carbon can be applied, such as an electrode of an electric double-layer capacitor. Furthermore, a carbon film layer to constitute the carbon-metal structure is not only a CNT-containing layer, but is only required to have a layer on which many projections which contain thread-like or needle-like fibrous carbon and are formed of carbon are developed. Furthermore, it is more preferable that the carbon film layer is a layer equipped with a region where fibrous carbon in a standing condition in a thickness direction of the film is arranged.

Figure 1:
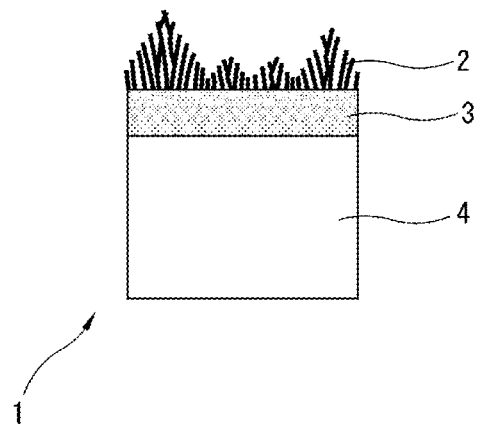
Figure 1:
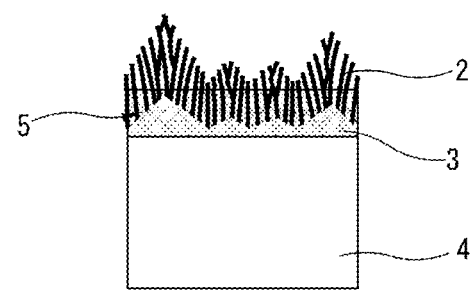

As shown in FIG. 1(a), a CNT device 1 according to an embodiment of the present invention is equipped with a CNT layer 2, a brazing material layer 3, and a metal pedestal 4. As shown in FIG. 1(b), a mixed layer 5 where an end portion of the CNT layer 2 is impregnated with a brazing material constituting the brazing material layer 3 is formed between the CNT layer 2 and the brazing material layer 3.

The CNT layer 2 is, for example, constituted of a CNT that is formed on a catalyst supported on a heat-resistant textured substrate 6. The heat-resistant textured substrate 6 and the catalyst 7 are explained in detail hereinafter with reference to FIG. 2. On the surface of the CNT layer 2, texture corresponding to a textured surface of the heat-resistant textured substrate 6 is formed. In the case of applying the CNT device 1 to an emitter, on the emitter surface, it is preferable for pillars of CNT bundle having an average height of 1 μm to 100 μm to have a pillar arrangement that is 1/5 to 5/1 in the ratio (H/R) of pillar height (H) to pillar spacing (R). The average height of the pillars is determined by calculating the average value of 10 (an arbitrary number as long as it is a plural number) pillars heights by obtaining a pillar height distribution by observing an emitter's section with a scanning electron microscope or by observing the surface with a laser microscope. In CNT, the size and the density of the pillar of CNT bundle are selected depending on the electric field concentration of CNT or lifetime of the CNT layer 2. Therefore, the heat resistant textured substrate is formed, for example, with a texture having an average height of 1 μm to 100 μm and a height/spacing ratio of 1/5 to 5/1. This average height is determined by a method similar to that for the average height of the pillars of the CNT layer 2. In order to increase the number of emitters, it is preferable that the texture has a smaller spacing. Therefore, spacing of the texture is preferably 50 μm or less, more preferably 30 μm or less. Furthermore, to increase electric field concentration on emitter, it is preferable that the texture has a greater spacing. Therefore, spacing of the texture is preferably 2 μm or greater, more preferably 3 μm of greater. A CNT for forming the CNT layer 2 may have a single layer or multilayer. It is preferable that CNT has a diameter of 30 nm or less.

The brazing material layer 3 is formed by a brazing material that bonds the CNT layer 2 and the metal pedestal 4. The brazing material is only required to be a brazing material having a melting point lower than that of the metal pedestal 4. Depending on the type of the metal pedestal 4, a preferable brazing material is suitably selected. For example, for the metal pedestal 4 of copper (Cu), a metal brazing material, such as silver (Ag) or an alloy (Ag—Cu alloy) of silver (Ag) and copper (Cu), is preferably used. For example, there is used a brazing material of Ag:Cu=72:28. Furthermore, it may contain an additive element such as tin (Sn) or indium (In) as an element to lower melting point of the metal brazing material (e.g., silver solder), and/or an additive element such as nickel, manganese (Mn) or palladium (Pa) to improve wettability of the metal brazing material (e.g., silver solder). By directly providing the CNT layer 2 with the brazing material layer 3, there is formed the mixed layer 5 (e.g., a mixed layer of 1 μm or less) where the CNT layer 2 is impregnated with the brazing material layer 3.

The thickness of the brazing material layer 3 is preferably 1 μm or greater, more preferably 3 μm or greater. This is because, when the brazing material layer 3 has a thickness less than 1 μm, there is a risk that bonding between the CNT layer 2 and the metal pedestal 4 becomes inferior, thereby making transfer of the CNT layer 2 difficult. On the other hand, when the brazing material layer 3 has a thickness greater than 50 μm, there is a risk that CNT is buried under the brazing material, thereby making it difficult to peel the CNT layer 2 from the heat-resistant textured substrate 6 that makes the CNT layer 2 grow. Furthermore, there is a risk that the CNT pillars transferred to the metal pedestal 4 are buried under the brazing material. Therefore, the thickness of the brazing material layer 3 is preferably 50 μm or less, more preferably 30 μm or less, still more preferably 10 μm or less. The thickness of the brazing material layer 3 is determined, for example, by dividing mass of the brazing material per unit area ($g/cm^2$) with true density ($g/cm^3$) of the brazing material.

Furthermore, the brazing material layer 3 is not limited to a single layer structure, but also may be formed into a multilayer structure (for example, in the after-mentioned FIG. 23, a two-layer structure having first and second brazing material layers 31, 32) where different metal brazing materials may be applied to the respective layers.

The metal pedestal 4 is a metal member having electric conductivity. It is preferable that the metal pedestal 4 is, for example, a metal member containing at least one of copper, tin, zinc, aluminum, magnesium, titanium, iron, cobalt, nickel, chromium, and silver. It is preferable that the metal pedestal 4 has a rigidity that achieves an easy handling when incorporating the CNT device 1 into an apparatus. For example, there is used a metal member having a thickness of 0.02 mm to 10 mm. Furthermore, in the embodiment, there is used a cylindrical metal pedestal 4, but there is used a metal member having an arbitrary shape such as plate shape, pillar shape, cone shape or hemispherical shape. Furthermore, it is not necessary for the metal pedestal 4 to form entirety of the metal pedestal 4 by metal, as long as it is equipped with a conductive layer at least on a surface on which the CNT layer is brazed.

<One Example of the Method for Manufacturing CNT Device 1>

Figure 2:
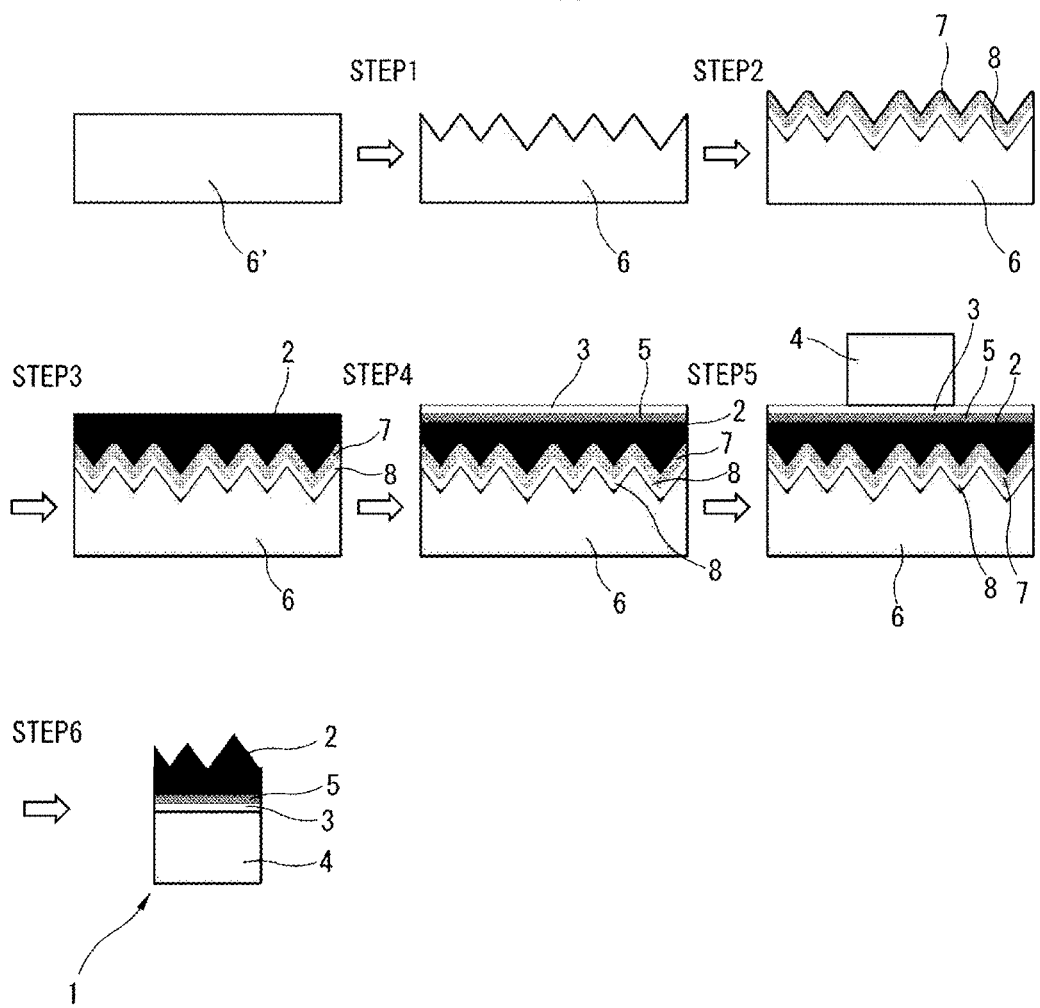
FIG. 2 is an explanatory view for explaining one example of CNT device manufacturing steps according to an embodiment of the present invention.

Next, with reference to FIG. 2, one example of the method for manufacturing the CNT device 1 according to an embodiment of the present invention is explained in detail.

In FIG. 2, firstly, texture is formed on a heat-resistant substrate 6' to obtain a heat-resistant textured substrate 6 (STEP 1). As the heat-resistant substrate 6', anything will do as long as it is a substrate with heat resistance. For example, there is used a substrate such as ceramic, quartz glass, alumina sintered body, SiC sintered body, highly heat-resistant alloy, Inconel or stainless steel. In particular, silicon substrate, quartz glass substrate, etc. of which high purity product is easily obtainable is generally used. Texture can be formed by mechanical cutting or chemical etching of the surface of the heat-resistant substrate 6'. In the case of using a silicon substrate as the heat-resistant substrate 6', the heat-resistant textured substrate 6 can be obtained by forming texture, for example, by anisotropic etching with an alkali solution such as NaOH aqueous solution. An ordered pyramid-shape texture can be obtained by a monocrystalline silicon substrate, and a random-shape texture can be obtained by a polycrystalline silicon substrate.

Next, a catalyst 7 for forming CNT is supported on the heat-resistant textured substrate 6 (STEP 2). The catalyst 7 is supported on the heat-resistant textured substrate 6, for example, by RF magnetron sputtering. As a catalyst substance for forming CNT, it is possible to use iron (Fe), cobalt (Co), nickel (Ni), molybdenum (Mo), etc. Furthermore, in order to sufficiently develop activity of the catalyst 7 on the heat-resistant textured substrate 6, a support layer 8 (e.g., aluminum (Al) oxide, magnesium (Mg) oxide, etc.) may be supported. It is preferable that the average film thickness of the catalyst 7 has a film thickness (e.g., 0.1 nm to 5 nm) to achieve the catalyst particle size that is optimum for CNT growth.

Next, CNT is grown on the heat-resistant textured substrate 6 to form the CNT layer 2 (STEP 3). CNT is synthesized, for example, by chemical vapor deposition (CVD). As a carbon source, it is possible to cite a hydrocarbon such as methane, ethylene or acetylene, carbon monoxide, or an alcohol such as ethanol or methanol. The reaction conditions of CVD method can be selected, for example, from a temperature range of from 600° C. to 1200° C., a pressure range of from 0.001 atm to 1 atm, and a reaction time of generally from one second to one hour. CNT is formed to be oriented in a direction that is generally perpendicular to the surface of the heat-resistant textured substrate 6. Furthermore, in the number of CNTs to grow on the catalyst 7, it is possible to control number density by the support amount of the catalyst 7. Depending on the support amount of the catalyst 7, not only number distribution of CNT to grow on the heat-resistant textured substrate 6, but also diameter and number of layers of CNT, thickness of CNT bundles, the degree of entanglement, etc. change.

Next, the brazing layer 3 is formed on the CNT layer 2 (STEP 4). The brazing material layer 3 is formed, for example, by co-vapor deposition or sputtering of a substance constituting the brazing material. In the case of using Ag—Cu as the brazing material, Ag having a higher vapor pressure is predominantly evaporated such that a brazing material with a higher Ag proportion is deposited on the CNT layer 2. Then, a composition gradient film with a gradually increased Cu proportion is formed. When conducting the vapor deposition, it is optional to use a brazing material adjusted to have a predetermined composition or to form the brazing material layer 3 of a predetermined composition by using separate metal materials as the raw materials. Furthermore, it is optional to provide the brazing material layer 3 on the side of the metal pedestal 4. In the case of providing the brazing material layer 3 on the side of the metal pedestal 4, there is formed a brazing material layer 3 having a composition gradient opposite to that in the case of providing the brazing material layer 3 on the CNT layer 2. A brazing material layer 3 with no composition gradient is formed in the case of forming the brazing material layer 3 by sputtering to evaporate elements irrespective of vapor pressure or in the case of forming the brazing material layer 3 by a vapor deposition using a plurality of vapor deposition sources where separate metal materials are used as the raw materials. Furthermore, composition of the brazing material layer 3 to be deposited may be different from composition of the brazing material layer 3 of the final device. For example, in case that Ag as a brazing material is deposited on the CNT layer 2, the brazing on the metal pedestal 4 made of Cu results in the formation of a brazing material layer 3 containing Ag—Cu alloy through mixture of Cu and Ag.

Next, the metal pedestal 4 is brazed on the CNT layer 2 (STEP 5). The brazing is conducted by heating at a temperature at which the brazing material of the brazing material layer 3 melts. In the case of using Ag—Cu alloy as the brazing material, it is preferable to conduct the brazing by heating at a temperature of 779° C. or higher since melting point of Ag—Cu alloy is 779° C. In the case of using another brazing material, the brazing temperature is adjusted in accordance with melting point of such brazing material. After brazing the metal pedestal 4 on the CNT layer 2 through the brazing material layer 3, the heat-resistant textured substrate 6 is peeled from the CNT layer 2, thereby resulting in the CNT device 1 (STEP 6). The timing when cutting the CNT device 1 into an arbitrary size may be either before or after peeling the heat-resistant textured substrate 6. When the brazing material layer 3 is formed on the entire surface of the CNT layer 2, then the metal pedestal 4 is brazed, and then the heat-resistant textured substrate is peeled, in case that the brazing material layer 3 is thin, the brazing material layer 3 and the CNT layer 2 are automatically cut and transferred to conform to the shape of the metal pedestal 4. For example, in case that the brazing material layer 3 is as thin as about 1-5 μm, the transfer occurs in the form of the metal pedestal 4. In case that the brazing material layer 3 is as thick as 10 μm or greater, the brazing material layer 3 in its entirety peels from the heat-resistant textured substrate 6, thereby transferred to around the metal pedestal 4, too. Furthermore, when vapor depositing the brazing material on the CNT layer 2, if the brazing material 3 is formed into a pattern by using a mask, the CNT layer 2 is attached to only the metal pedestal 4. Since the brazing material layer 3 does not exist at other parts of the CNT layer 2, only a pattern section of the CNT layer 2 is transferred to the metal pedestal 4 at a separation between the metal pedestal 4 and the heat-resistant textured substrate 6. With this, the CNT layer 2 is more nicely automatically cut to conform to the shape of the metal pedestal 4. Furthermore, the CNT layer 2 is automatically cut to conform to the shape of the metal pedestal 4 by forming the brazing material layer 3 on the metal pedestal 4, too. Furthermore, if a plurality of the metal pedestals 4 are brazed on the CNT layer 2, and then the heat-resistant textured substrate 6 and the metal pedestal 4 are separated from each other, the CNT layer 2 is automatically cut to conform to each metal pedestal 4 even in the case of forming the CNT layer 2 on the entire surface or even in the case of forming the same into a pattern.

The following Examples 1 to 7 are those according to CNT devices prepared based on the manufacturing method shown in FIG. 2. They show observation results, evaluation results, etc. of their respective CNT devices.

Example 1

As Example 1 of the present invention, CNT devices 1a, 1b applicable to an emitter of an X-ray apparatus were manufactured by a CNT device manufacturing method (FIG. 2) according to an embodiment of the present invention. In this example, a Si substrate was used as the heat-resistant textured substrate 6, a copper pedestal of $\phi 6$ mm and a thickness of 4.5 mm was used as the metal pedestal 4, and an Ag—Cu alloy was used the brazing material. Furthermore, Fe was used as the catalyst 7, and $AlO_x$ was used for the support layer 8.

Firstly, the Si substrate of which surface had been rubbed with sandpaper was treated with hydrofluoric acid to remove $SiO_2$. Then, a texture of 5 µm to 10 µm was formed by an anisotropic etching for 30 minutes in 2 wt % NaOH/20 vol % isopropyl alcohol aqueous solution at 80° C. (STEP 1). Next, Fe by 4 nm and Al by 15 nm were supported on the Si substrate surface by using RF magnetron sputtering (STEP 2). When contacted with air, Al was oxidized into $AlO_x$.

The Si substrate with the catalyst supported thereon was installed in a cylindrical CVD reaction tube. Under a flow of $H_2$/Ar, it was heated up to 700° C., followed by annealing for 10 minutes. Then, $C_2H_2$ at 1.0 Torr/$H_2$ at 10 Torr/Ar balance ($P_{total}$=76 Torr) was introduced to synthesize CNT for 1 minute at 700° C. (STEP 3).

On the CNT grown on the Si substrate, Ag and Cu were co-vapor deposited in vacuo (e.g., $10^{-4}$ Pa) to form the brazing material layer 3 (Ag—Cu alloy) on the surface of the CNT layer 2 (STEP 4). The brazing material layer of the CNT device 1a, 1b was controlled by changing the charge amount of the Ag and Cu as the vapor deposition sources, and the vapor deposition was conducted until running out of Ag and Cu as the vapor deposition sources. The vapor deposition times of the CNT devices 1a, 1b were respectively 60 seconds and 30 seconds, and their thicknesses of the brazing material layer 3 were respectively 10.6 µm and 3.3 µm.

Figure 3:
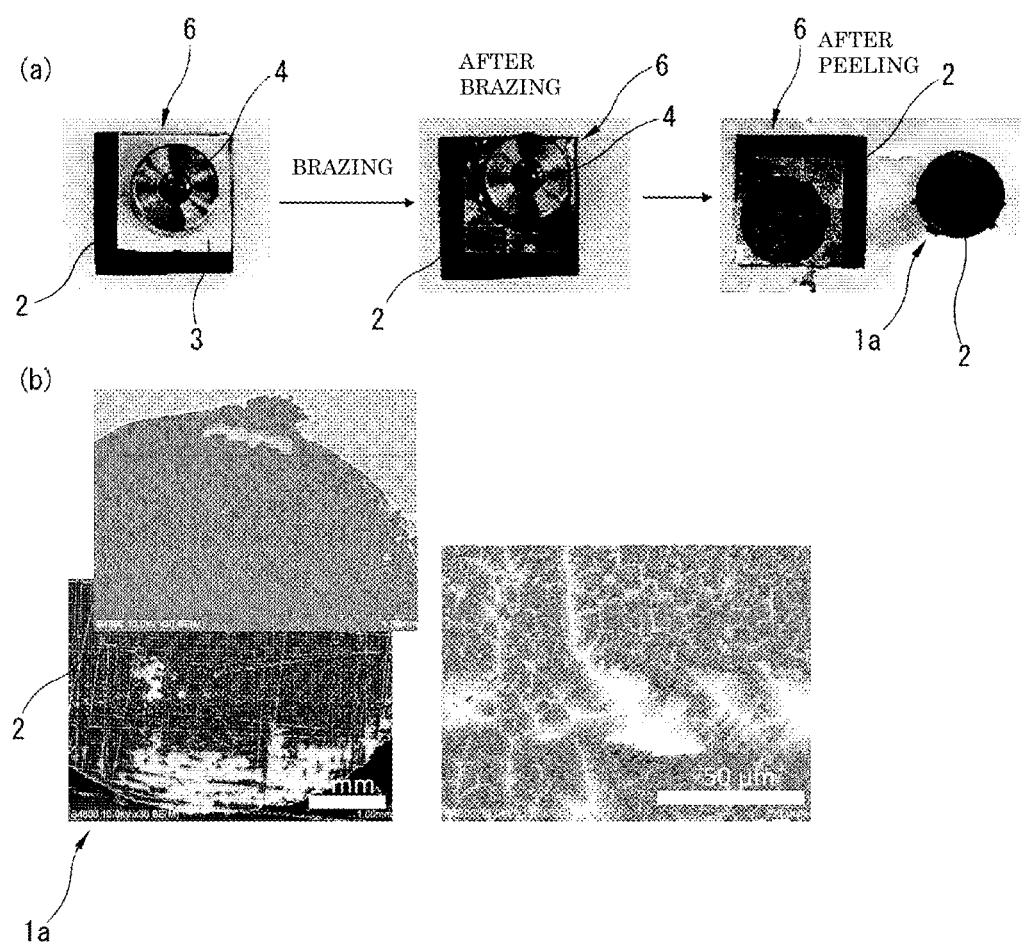
FIG. 3(a) is a view for explaining before and after brazing of a CNT device (brazing material layer's thickness: 10.6 μm) of Example 1.
FIG. 3(b) shows SEM images of a CNT layer surface of the same CNT device.
Figure 4:
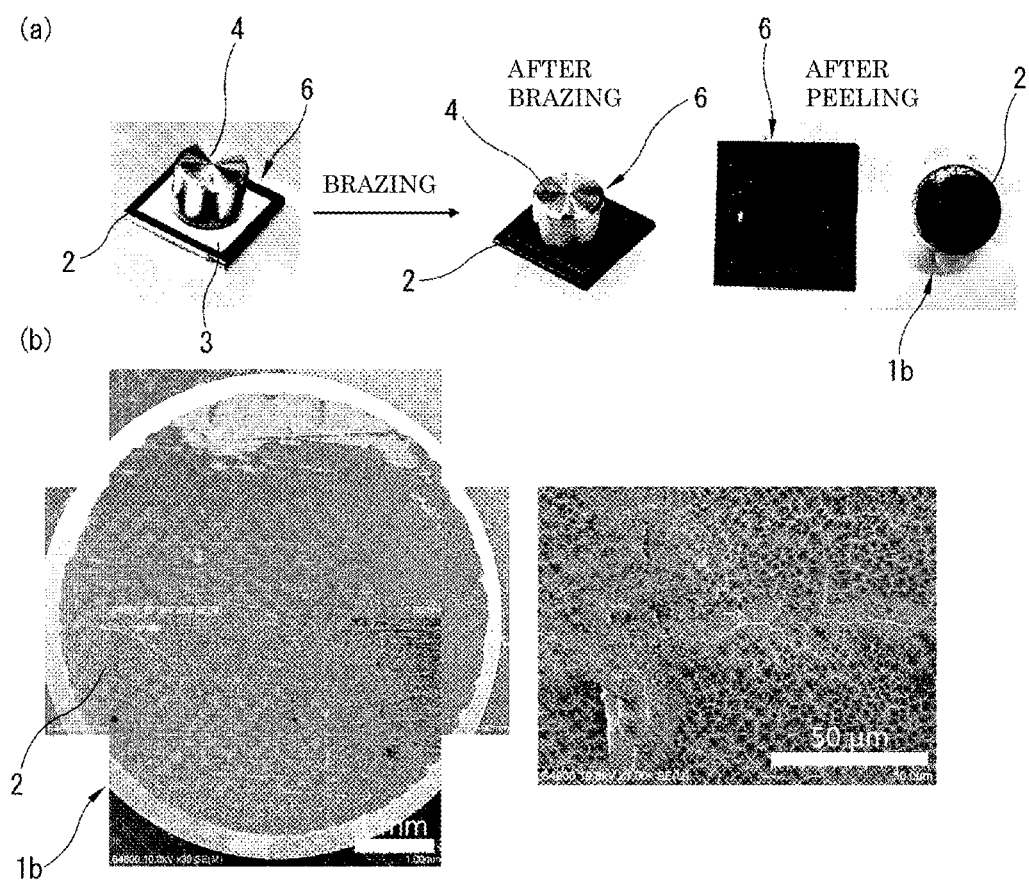
FIG. 4 is a view for explaining before and after brazing of a CNT device (brazing material layer's thickness: 3.3 μm) of Example 1.

The metal pedestal 4 was provided on the brazing material layer 3, and the heating was conducted under conditions of 780° C. and Ar at 10 Torr for 5 minutes (CNT device 1a) or 11 minutes (CNT device 1b), thereby brazing the metal pedestal 4 on the CNT layer 2 (STEP 5). As shown in FIGS. 3 and 4, in each CNT device 1a, 1b, it was possible to peel the CNT layer 2, and the CNT layer 2 was transferred to the metal pedestal 4. However, when manufacturing the CNT devices 1a, 1b, there occurred some occasions in which a uniform CNT layer was not transferred to the entire surface of the metal pedestal 4, thereby causing a task in reproducibility.

Next, field emission performance (hereinafter referred to as FE performance) of the CNT device 1b was evaluated.

Figure 5:
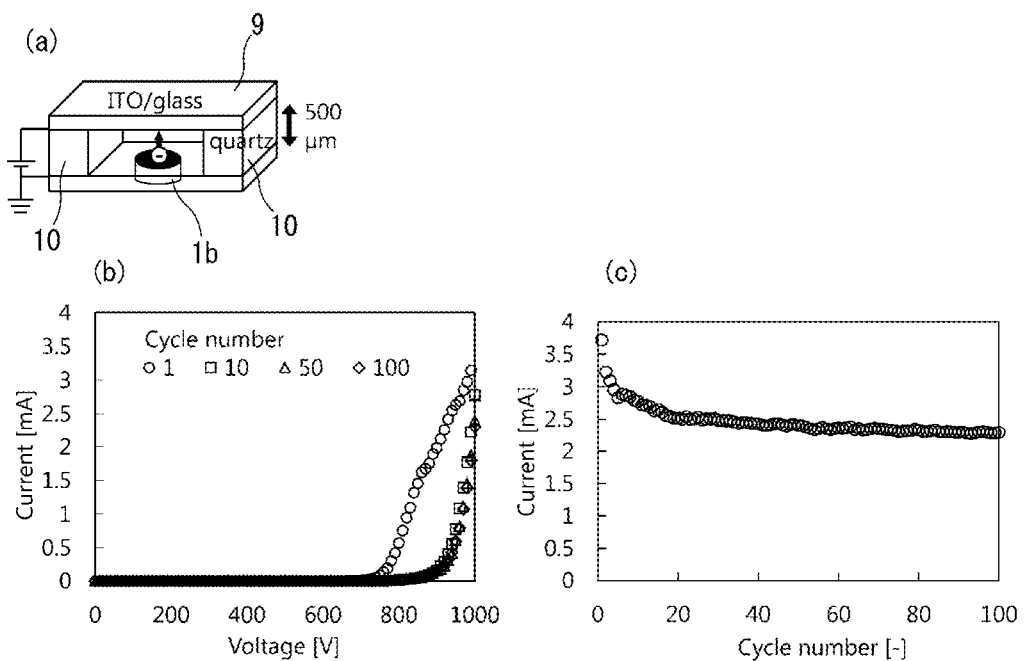
FIG. 5(a) is a schematic view of a device for evaluating electrode characteristics of CNT devices.
FIG. 5(b) is a characteristic diagram showing electrode characteristics (I-V characteristics) of the CNT device (brazing material layer's thickness: 3.3 μm) of Example 1.
FIG. 5(c) is a characteristic diagram showing electrode characteristics (cycle characteristics) of the same CNT device.

As shown in FIG. 5(a), the FE performance evaluation was conducted by using the CNT device 1b as cathode and a glass substrate 9 with an ITO film (tin-oxide-doped indium oxide film) as anode. They were opposed to each other by using a quartz glass of a thickness of 500 µm as a spacer 10. In a vacuum of $10^{-5}$ Pa, the current value was measured when applying a sweep voltage of 0-1000 V by 100 cycles to evaluate FE characteristic and lifetime of the CNT device 1b. As shown in FIGS. 5(b) and 5(c), an emission current of 2.5 mA or greater (area: 0.28 $cm^2$; electric current density: 8.8 mA/$cm^2$ or greater) was stably obtained when the distance between the electrodes was 500 µm and the applied voltage was 1000 V, that is, at an electric field strength of 2 V/µm. Therefore, the CNT device 1b was good in terms of its characteristic and lifetime as emitter.

Example 2

In Example 2, CNT device 11 with an Ag—Cu brazing material layer having a thickness of 26.7 µm was manufactured. In this example, Si substrate was used as the heat-resistant textured substrate 6, and a copper pedestal of $\phi 6$ mm and a thickness of 4.5 mm was used as the metal pedestal 4. In the explanation of Example 2, detailed explanations of steps (steps of STEP 1 to STEP 3) similar to those of Example 1 were omitted (Examples 3-7 are the same).

Firstly, STEP 1 to STEP 3 were conducted similar to Example 1, except that annealing at the CNT synthesis was for 3 minutes and that $C_2H_2$ partial pressure was 0.5 Torr, thereby synthesizing CNT on the Si substrate. Then, on the CNT grown on the Si substrate, Ag and Cu were co-vapor deposited for 75 seconds, thereby forming the brazing material layer 3 (Ag—Cu brazing material layer) on the surface of the CNT layer 2 (STEP 4). The formation of the brazing material layer 3 was conducted in vacuo (e.g., $10^{-4}$ Pa) by preparing a raw material of Ag:Cu 72:28 wt %.

The metal pedestal 4 was provided on the brazing material layer 3, and the metal pedestal 4 was brazed on the CNT layer 2 by heating for 5 minutes under conditions of 800° C. and Ar at 10 Torr (STEP 5). After brazing, the metal pedestal 4 was peeled off the Si substrate (heat-resistant textured substrate 6), thereby fabricating the CNT device 11 of Example 2 (STEP 6).

Figure 6:
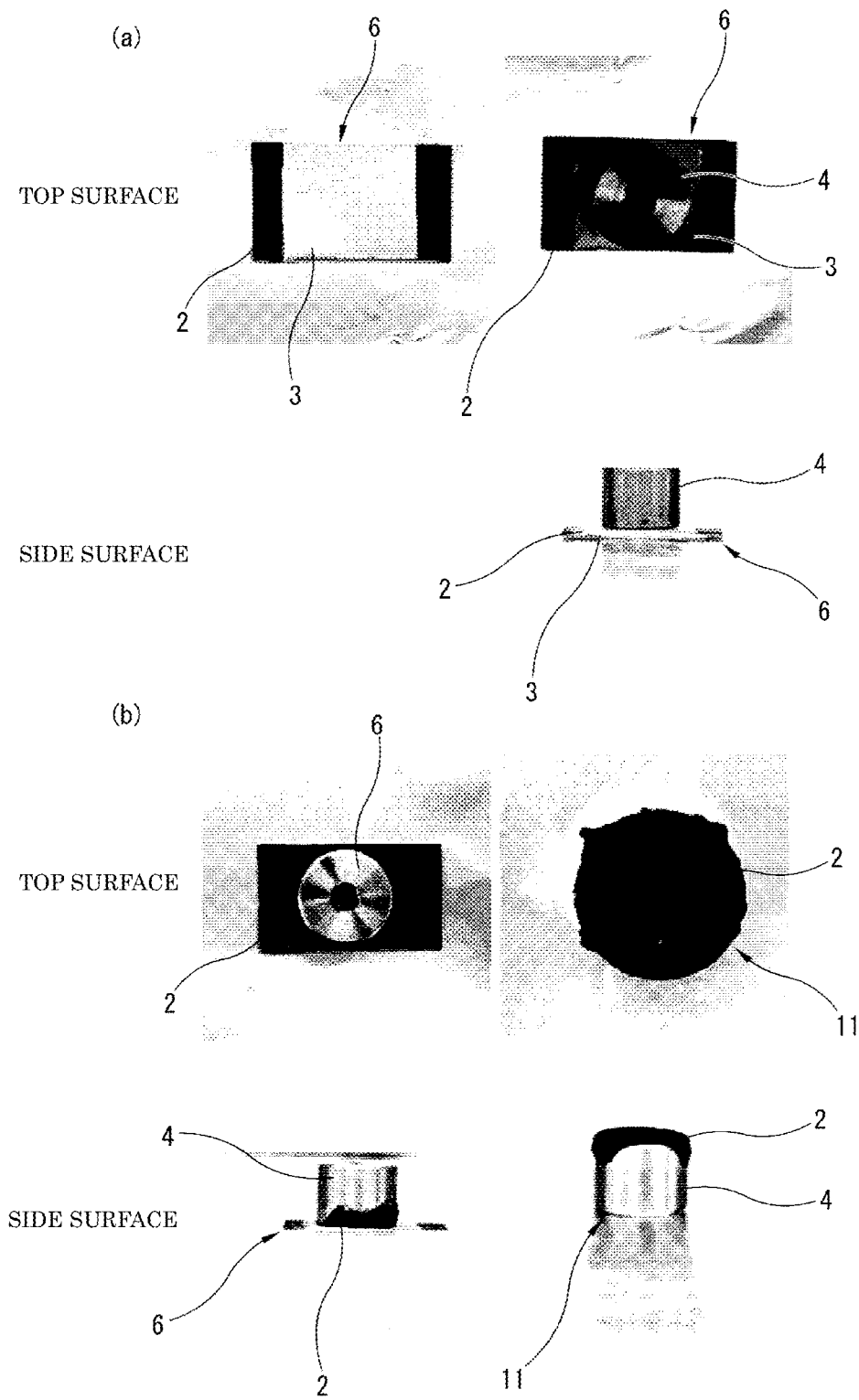

As shown in FIG. 6, the CNT layer 2 was transferred onto the metal pedestal 4 by peeling the metal pedestal 4 (see the right upper drawing of FIG. 6(b)). Furthermore, the Ag—Cu film around the metal pedestal 4 was attached to a side surface portion of the metal pedestal 4 (see the left upper, left lower and right lower drawings of FIG. 6(b)). Furthermore, since the CNT layer 2 was peeled off the heat-resistant textured substrate 6, the substrate surface of the heat-resistant textured substrate 6 after peeling turned into an exposed condition (see the left upper drawing of FIG. 6(b)).

Example 3

In Example 3, CNT device 12 with an Ag brazing material layer having a thickness of 35.3 μm was manufactured. In this example, CNT device 12 was manufactured by a method similar to Example 2.

Firstly, CNT was synthesized on Si substrate by a method similar to STEP 1 to STEP 3 of Example 2. Then, on the CNT grown on the Si substrate, Ag was vapor deposited for 40 seconds in vacuo (e.g., $10^{-4}$ Pa), thereby forming the brazing material layer 3 (Ag brazing material layer) on the surface of the CNT layer 2 (STEP 4).

The metal pedestal 4 was provided on the brazing material layer 3, and the metal pedestal 4 was brazed on the CNT layer 2 by heating for 5 minutes under conditions of 800° C. and Ar at 10 Torr (STEP 5). After brazing, the metal pedestal 4 was peeled off the Si substrate (heat-resistant textured substrate 6), thereby fabricating the CNT device 12 of Example 3 (STEP 6).

Figure 7:
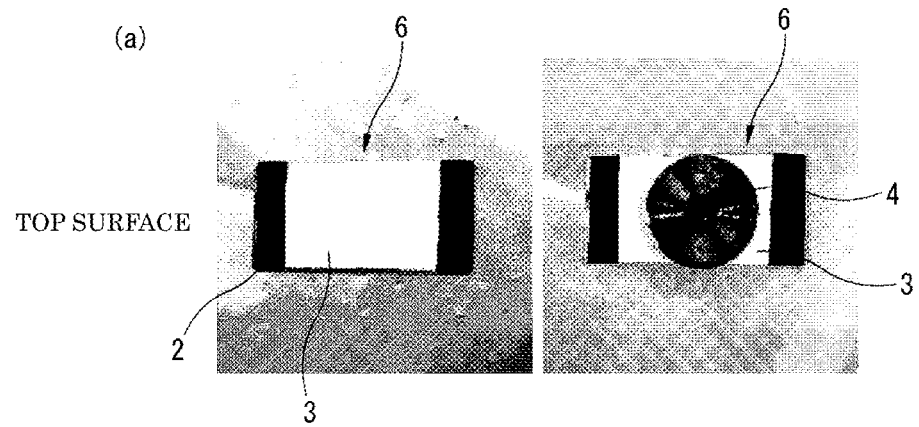
Figure 7:
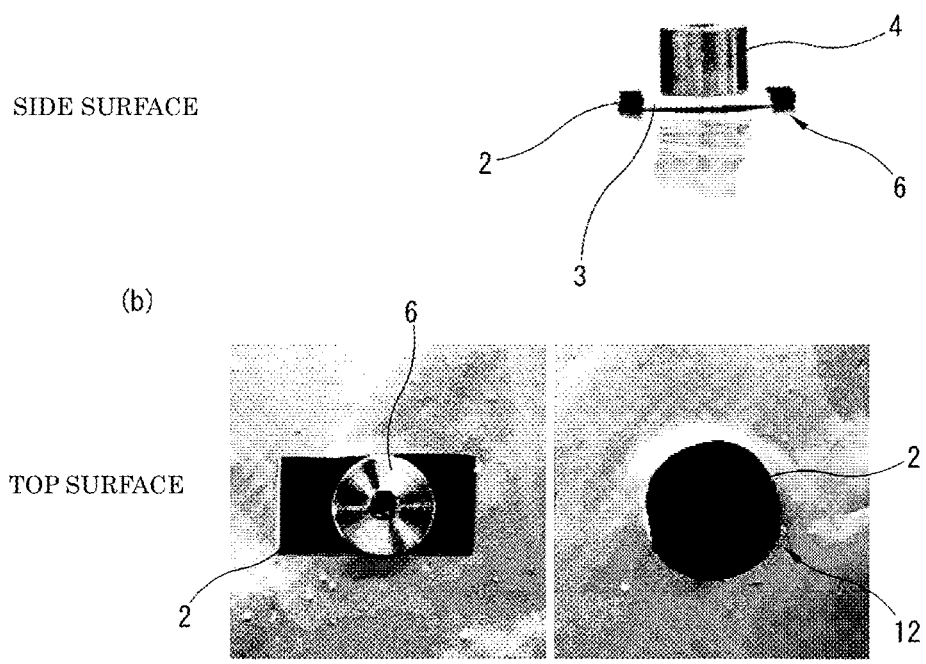
Figure 7:
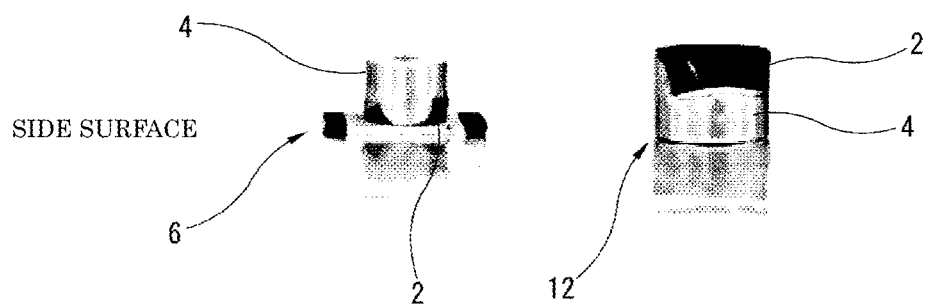

As shown in FIG. 7, the CNT layer 2 was transferred onto the metal pedestal 4 by peeling the metal pedestal 4 (see the right upper drawing of FIG. 7(b)). Furthermore, the Ag film around the metal pedestal 4 was attached to a side surface portion of the metal pedestal 4 (see the left upper, left lower and right lower drawings of FIG. 7(b)). Furthermore, since the CNT layer 2 was peeled off the heat-resistant textured substrate 6, the substrate surface of the heat-resistant textured substrate 6 after peeling turned into an exposed condition (see the left upper drawing of FIG. 6(b)).

Example 4

In Example 4, three CNT devices 13a to 13c which were different in brazing time were manufactured. In this example, the CNT devices 13a to 13c were manufactured by a method similar to Example 1, except that the thickness of the brazing material layer, the brazing temperature and the brazing time.

Firstly, CNT was synthesized on Si substrate by a method similar to STEP 1 to STEP 3 of Example 1. Then, on the CNT grown on the Si substrate, Ag and Cu were co-vapor deposited for 30 seconds in vacuo (e.g., $10^{-4}$ Pa), thereby forming the brazing material layer 3 (Ag—Cu brazing material layer) on the surface of the CNT layer 2 (STEP 4). The thicknesses of the brazing material layers 3 of the CNT devices 13a to 13c were respectively 3.6 μm, 3.4 μm, and 3.5 μm.

Figure 8:
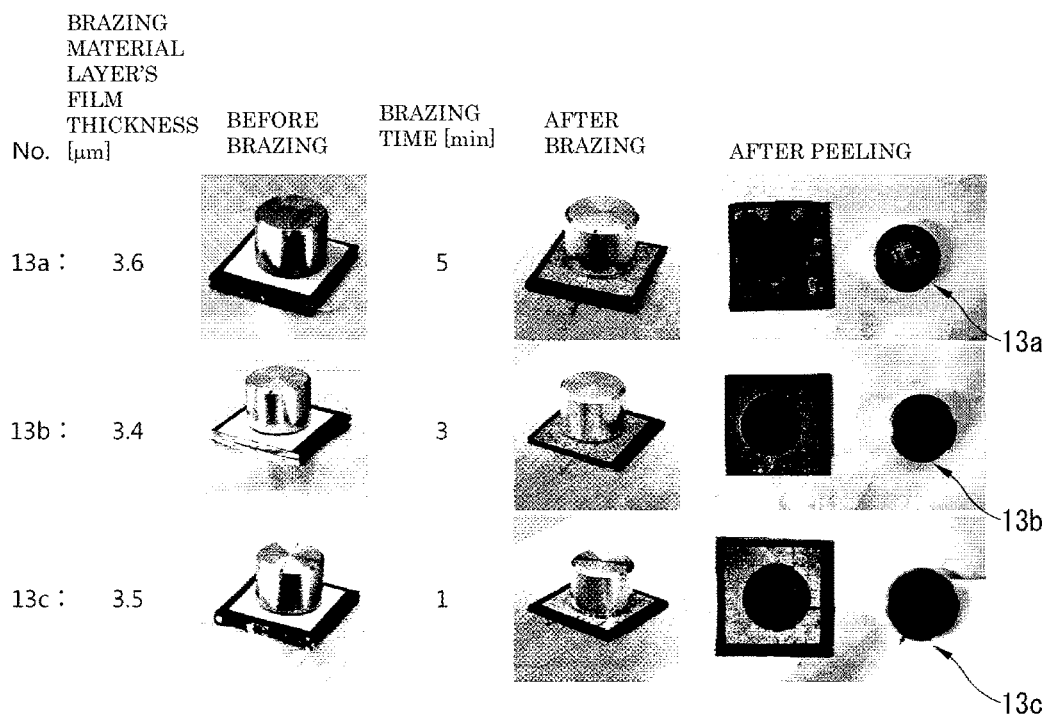
FIG. 8 is a view for explaining outlines of CNT devices of Example 4.

As shown in FIG. 8, the metal pedestal 4 was provided on the brazing material layer 3, and the metal pedestal 4 was brazed on the CNT layer 2 by heating for 5 minutes, 3 minutes or 1 minute under conditions of 800° C. and Ar at 10 Torr (STEP 5). After brazing, the metal pedestal 4 was peeled off the Si substrate (heat-resistant textured substrate 6), thereby fabricating the CNT devices 13a to 13c of Example 4 (STEP 6).

In each of the CNT devices 13a to 13c, the CNT layer 2 was transferred onto the metal pedestal 4 by peeling the metal pedestal 4. Furthermore, the Ag—Cu film and the CNT layer 2, which were outside of the contact surface of the metal pedestal 4, were not transferred to the metal pedestal 4, but remained on the surface of the heat-resistant textured substrate 6. Furthermore, the CNT layer 2 was peeled in the form of the metal pedestal 4 from the heat-resistant textured substrate 6. With this, in the heat-resistant textured substrate 6 after peeling, the substrate surface of a portion corresponding to the metal pedestal 4 turned into an exposed condition.

Figure 9:
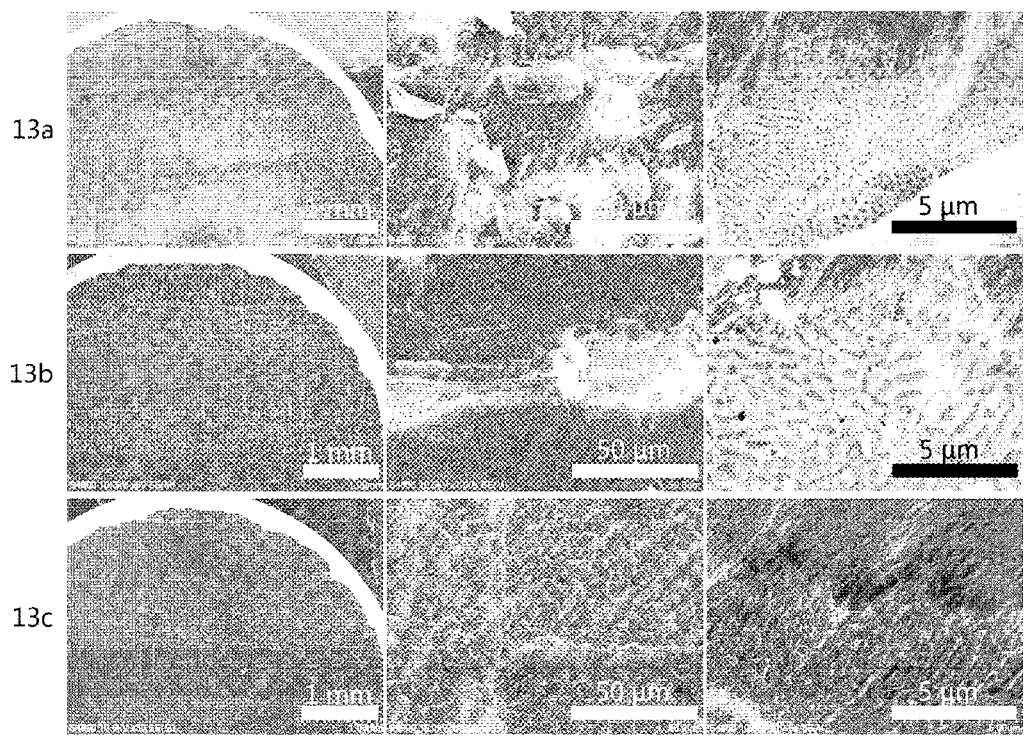
FIG. 9 shows SEM images of CNT layer surfaces of the CNT devices of Example 4.

As shown in FIG. 9, in the CNT devices 13a, 13b, on a part of the surface of the CNT layer 2 on the metal pedestal 4, a portion where the brazing material had leaked was confirmed, but it was almost not found in the CNT device 13c. That is, it is considered in the surface observation by SEM images that a nicest brazing was made in the CNT device 13c. From this result, it is understood that, as the brazing time becomes long, there is a risk that the brazing material permeates until an interface between the CNT layer 2 and the heat-resistant textured substrate 6, and then a part of the surface of the CNT layer after the transfer is covered with the brazing material. Furthermore, if the brazing material flows over the surface of the CNT layer 2, and CNT is buried in the brazing material, there is a risk to lower the electron emission performance of the CNT device.

Figure 10:
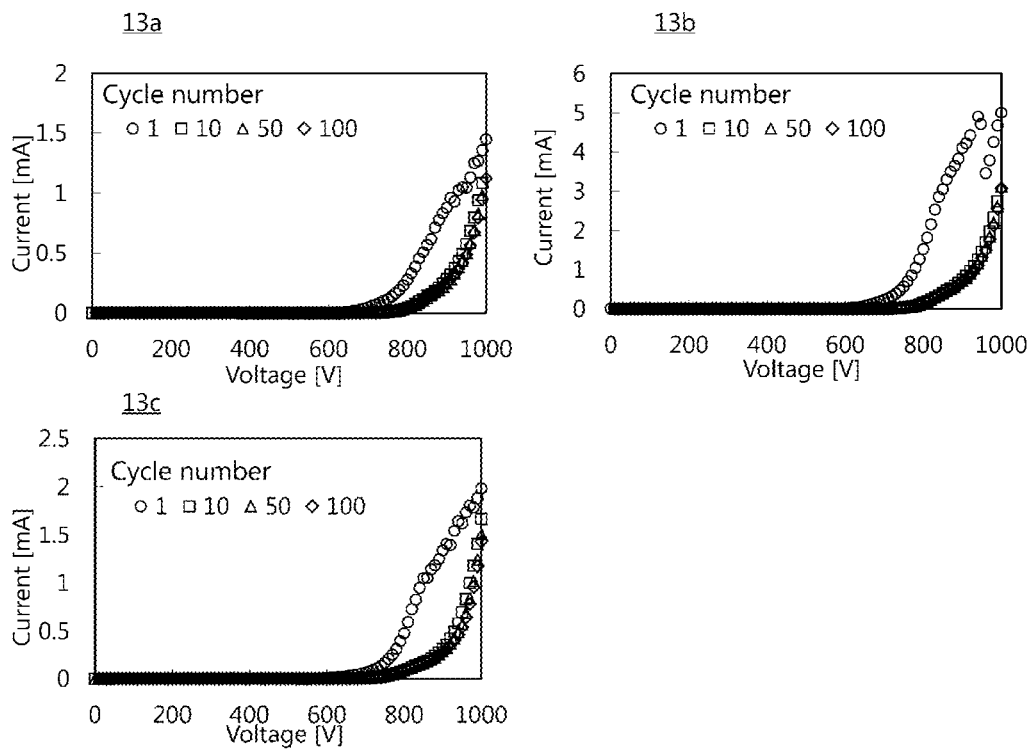
FIG. 10 shows characteristic diagrams showing electrode characteristics (I-V characteristics) of the CNT devices of Example 4.
Figure 11:
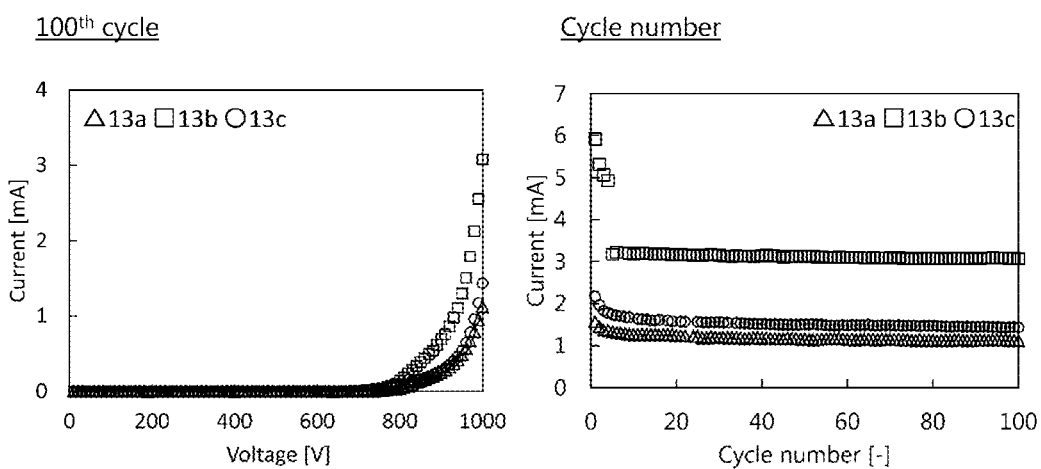
FIG. 11 shows characteristic diagrams showing electrode characteristics (cycle characteristics) of the CNT devices of Example 4.

FIGS. 10 and 11 show FE performance evaluation results of CNT devices 13a to 13c. Similar to the FE performance evaluation of Example 1, the FE performance evaluation was conducted by using as cathode one of the CNT devices 13a to 13c and as anode a glass substrate 9 with an ITO film (see FIG. 5(a)). They were opposed to each other by using a quartz glass of a thickness of 500 μm as a spacer 10. In a vacuum of $10^{-5}$ Pa, the current value was measured when applying a sweep voltage of 0-1000 V by 100 cycles to evaluate FE characteristic and lifetime of the CNT device 13a to 13c. As shown in FIGS. 10 and 11, the CNT device 13b showed the best result as the characteristics of emitter. From this result, it is understood that, even if the brazing material is exposed over a part of the surface of the CNT layer 2, there is no problem in FE performance. Therefore, in the case of using Ag—Cu brazing material, in a range of 1 μm to 50 μm in thickness of the brazing material layer, optimum brazing conditions (temperature and time) are selected. In the case of using other brazing materials, temperature and time of the brazing are suitably adjusted in accordance with melting points of the brazing materials.

Example 5

In Example 5, three CNT devices 14a to 14c, which were different in thickness of Ag—Cu brazing material layer, were manufactured.

Firstly, CNT was synthesized on Si substrate by a method similar to STEP 1 to STEP 3 of Example 4. Then, on the CNT grown on the Si substrate, Ag and Cu were co-vapor deposited in vacuo (e.g., 104 Pa), thereby forming the brazing material layer 3 (Ag—Cu brazing material layer) on the surface of the CNT layer 2 (STEP 4). The vapor deposition times of the brazing material layers 3 of the CNT devices 14a to 14c were respectively 20 seconds, 40 seconds, and 50 seconds. The thicknesses were respectively 1.3 μm, 4.8 μm, and 12.5 μm.

Figure 12:
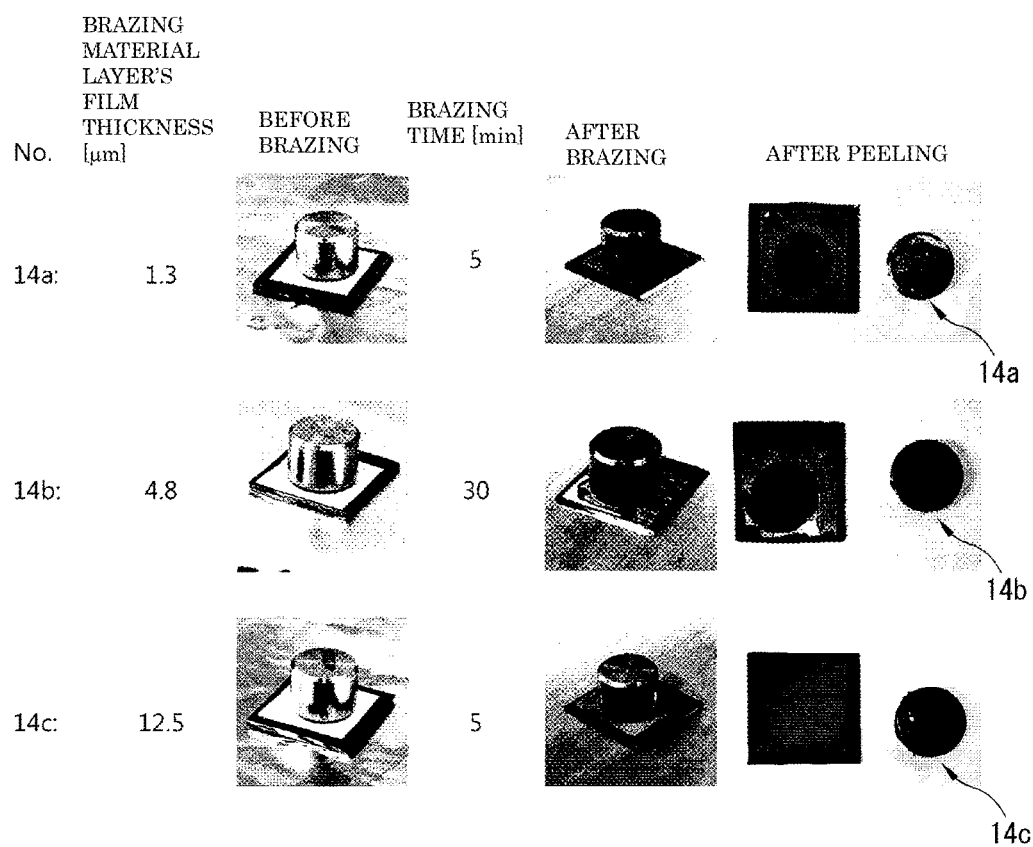
FIG. 12 is a view for explaining outlines of CNT devices of Example 5.

As shown in FIG. 12, the metal pedestal 4 was provided on the brazing material layer 3, and the metal pedestal 4 was brazed on the CNT layer 2 by heating for 1 minute under conditions of 800° C. and Ar at 10 Torr (STEP 5). After brazing, the metal pedestal 4 was peeled from the Si substrate (heat-resistant textured substrate 6), thereby fabricating the CNT devices 14a to 14c of Example 5 (STEP 6).

Figure 13:
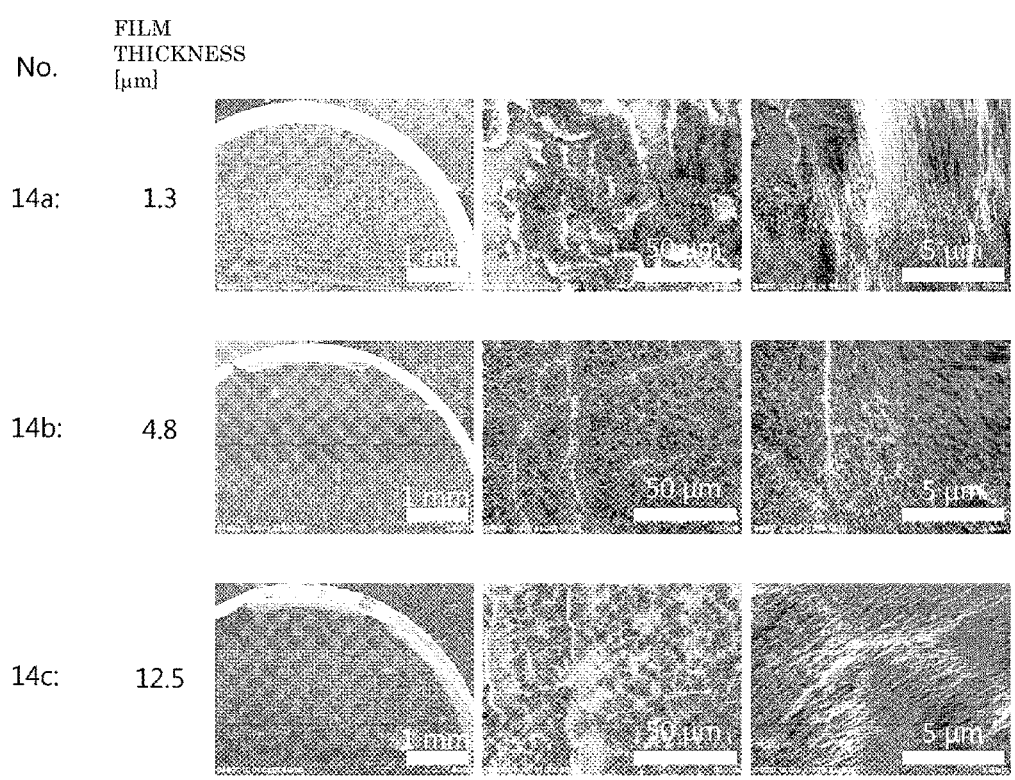
FIG. 13 shows SEM images of CNT layer surfaces of the CNT devices of Example 5.

FIG. 13 shows surface SEM images of the CNT layers 2 of the CNT devices 14a to 14c. In the CNT device 14a, the brazing material layer 3 and the CNT layer 2 were transferred in the shape of the metal pedestal 4, but the brazing material leaked over many of the surface of the CNT layer 2. From this, it is considered to have a risk that, as the film thickness of the brazing material layer 3 becomes thin, the brazing material is easily absorbed into the CNT layer 2. In the CNT device 14b, the CNT layer 2 was uniformly transferred in the shape of the metal pedestal 4 to the entire surface of the metal pedestal 4. Furthermore, in the CNT device 14c, the CNT layer 2 in a square was transferred to the metal pedestal 4 in a condition that the brazing material layer 3 was vapor deposited, and a part of the CNT layer 2 (and the brazing material layer 3) was transferred in a manner to cling to around the metal pedestal 4. That is, in the CNT device 14c, the brazing material layer 3 in its entirety was transferred to the metal pedestal 4. Then, on a part of the surface of the transferred CNT layer 2, a portion where the brazing material had leaked was observed. From this, it is considered to have a risk that, as the film thickness of the brazing material layer 3 increases, the brazing material becomes excessive, and a part of the brazing material leaks over the surface of the CNT layer 2.

Figure 14:
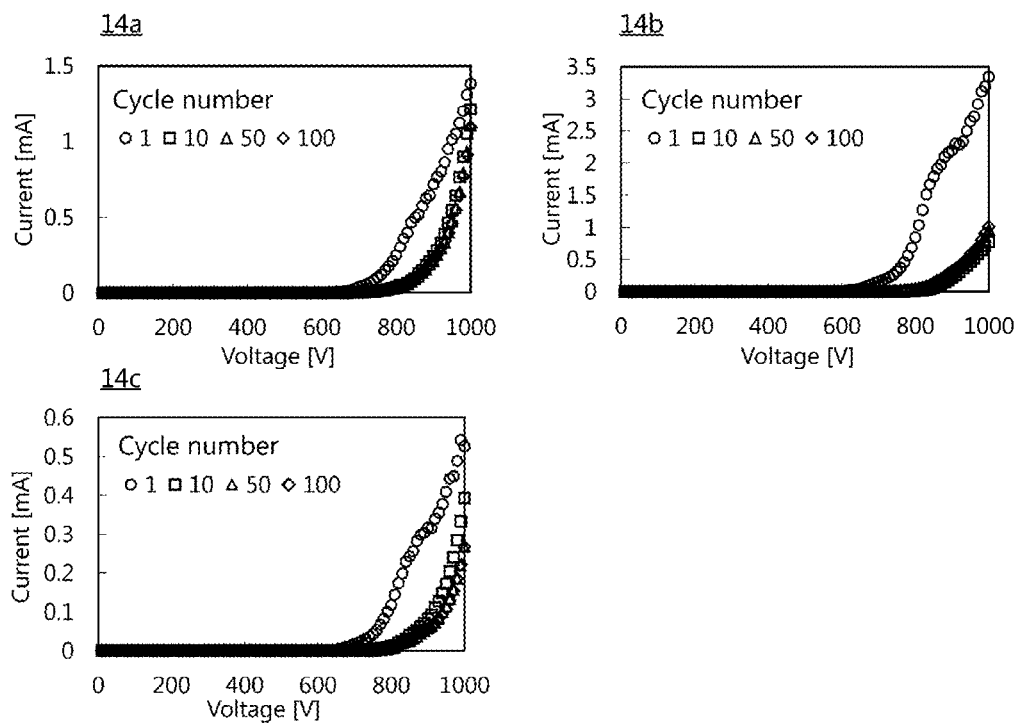
FIG. 14 shows characteristic diagrams showing electrode characteristics (I-V characteristics) of the CNT devices of Example 5.
Figure 15:
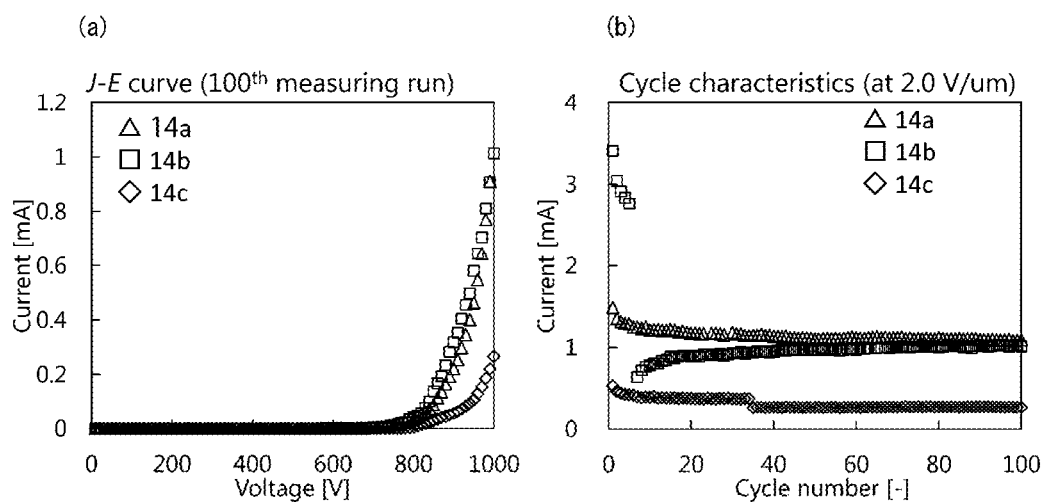
FIG. 15 is a characteristic diagram showing electrode characteristics (I-V characteristics after 100 cycles) of the CNT devices of Example 5.

FIGS. 14 and 15 show FE performance evaluation results of CNT devices 14a to 14c. Similar to the FE performance evaluation of Example 1, the FE performance evaluation was conducted by using as cathode one of the CNT devices 14a to 14c and as anode a glass substrate 9 with an ITO film (see FIG. 5(a)). They were opposed to each other by using a quartz glass of a thickness of 500 μm as a spacer 10. In a vacuum of $10^{-5}$ Pa, the current value was measured when applying a sweep voltage of 0-1000 V by 100 cycles to evaluate FE characteristic and lifetime of the CNT device 14a to 14c.

The CNT device 14a was confirmed to have a good performance of about 1.1 mA, although leak of the brazing material over the surface was confirmed for the most part in the observation by SEM. In the CNT device 14b, although a large current flowed at the initial stage, and then the current amount lowered, it maintained a good performance even after 100 cycles. The CNT device 14c was about 0.27 mA in FE performance, and was lower in FE performance as compared with the other CNT devices 14a, 14b.

Example 6

In Example 6, two CNT devices 15a, 15b, which were different in brazing temperature and brazing time, were manufactured.

Firstly, CNT was synthesized on Si substrate by a method similar to STEP 1 to STEP 3 of Example 4. Then, on the CNT grown on the Si substrate, Ag and Cu were co-vapor deposited in vacuo (e.g., $10^{-4}$ Pa), thereby forming the brazing material layer 3 (Ag—Cu brazing material layer) on the surface of the CNT layer 2 (STEP 4). The vapor deposition times of the brazing material layers 3 of the CNT devices 15a, 15b were respectively 20 seconds and 30 seconds. The thicknesses were respectively 1.2 μm and 1.0 μm.

Figure 16:
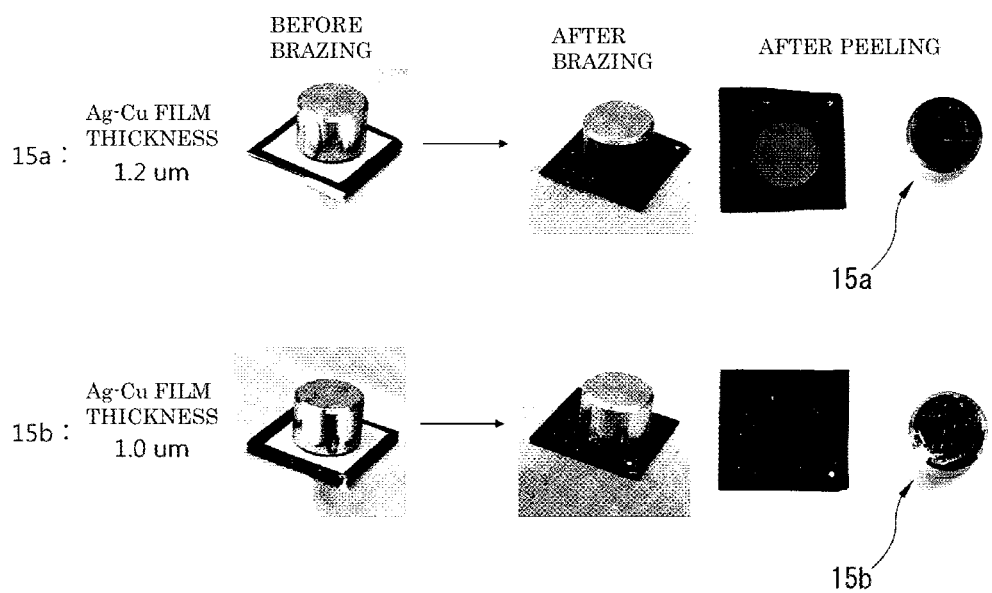
FIG. 16 is a view for explaining outlines of CNT devices of Example 6.

As shown in FIG. 16, the metal pedestal 4 was provided on the brazing material layer 3, and the metal pedestal 4 was brazed on the CNT layer 2. The brazing was conducted for the CNT device 15a by heating for 5 minutes under conditions of 820° C. and Ar at 10 Torr, and the brazing was conducted for the CNT device 15b by heating for 30 minutes under conditions of 800° C. and Ar at 10 Torr (STEP 5). After brazing, the metal pedestal 4 was peeled off the Si substrate (heat-resistant textured substrate 6), thereby fabricating the CNT devices 15a, 15b of Example 6 (STEP 6).

In each of the CNT devices 15a, 15b, although the brazing material leaked somewhat over the surface of the CNT layer 2, the CNT layer 2 was transferred in the shape of the metal pedestal 4.

Example 7

Figure 17:
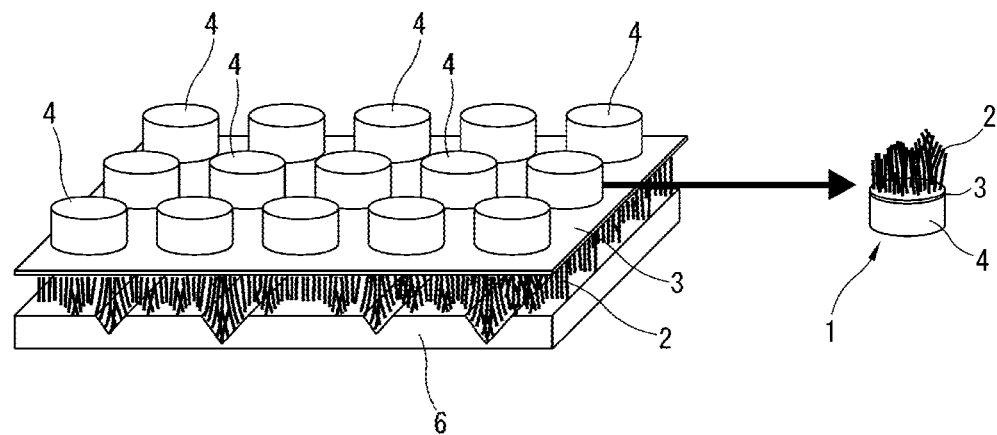
FIG. 17 is an explanatory view for explaining another example of CNT device manufacturing steps according to an embodiment of the present invention.

As shown in FIG. 17, CNT devices 16a, 16b of Example 7 are those prepared by arranging a plurality of the metal pedestals 4 on the brazing material layer 3 on the CNT layer 2 and then brazing the CNT layers 2 on the metal pedestals 4.

Firstly, CNT was synthesized on Si substrate by a method similar to STEP 1 to STEP 3 of Example 4. Then, on the CNT grown on the Si substrate, Ag and Cu were co-vapor deposited in vacuo (e.g., $10^{-4}$ Pa), thereby forming the brazing material layer 3 (Ag—Cu brazing material layer) on the surface of the CNT layer 2 (STEP 4). The vapor deposition times of the brazing material layers 3 of the CNT devices 16a, 16b were respectively 30 seconds and 40 seconds. The thicknesses were respectively 4.8 μm and 4.5 μm.

Figure 18:
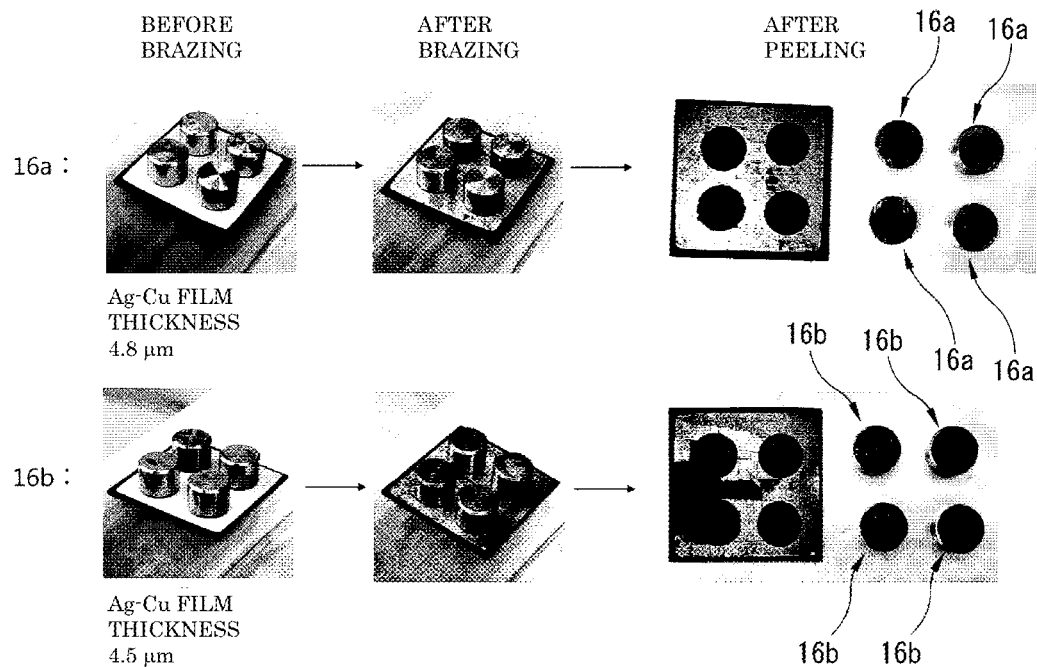
FIG. 18 is a view explaining outlines of CNT devices of Example 7.

As shown in FIG. 18, a plurality of the metal pedestals 4 were provided on the brazing material layer 3, and the metal pedestals 4 were brazed on the CNT layer 2 by heating for 1 minute under conditions of 800° C. and Ar at 10 Torr (STEP 5). After brazing, the metal pedestal 4 was peeled off the Si substrate (heat-resistant textured substrate 6), thereby fabricating the CNT devices 16a, 16b of Example 6 (STEP 6).

In the CNT device 16a, the brazing material layer 3 was automatically cut in the shape of the metal pedestal 4, and the CNT layer 2 was transferred at the metal pedestal 4 to conform to the shape of the metal pedestal 4. The brazing material leaked over the surface of the CNT layer 2. Furthermore, in the CNT device 16b, although the shape of the brazing material layer 3 on the side of the heat-resistant textured substrate 6 became irregular, the CNT layer 2 was uniformly transferred to the entire surface of the metal pedestal 4 without spilling out. Leak of the brazing material over the surface of the CNT layer 2 was not confirmed.

The brazing conditions and the FE performance evaluation results of Example 1 to Example 7 are shown in Table 1. As shown in Table 1, when using an Ag—Cu brazing material, for example, the film thickness of the brazing material layer 3 can be selected within a range of 1 μm to 50 μm, preferably 3 μm to 10 μm, the temperature can be selected within a range of 780° C. to 820° C., and the time can be selected within a range of 30 minutes or shorter.

TABLE 1

| Examples | Brazing Material | Film Thickness | Temp. | Time | Transfer | Performance |
|---|---|---|---|---|---|---|
| Ex. 1 (1a) | Ag—Cu | 10.6 μm | 780° C. | 5 min | Δ | |
| Ex. 1 (1b) | Ag—Cu | 3.3 μm | 780° C. | 11 min | Δ | ◯ |
| Ex. 2 | Ag—Cu | 26.7 μm | 800° C. | 5 min | ◯ | |
| Ex. 3 | Ag | 35.3 μm | 800° C. | 5 min | ◯ | |
| Ex. 4 (13a) | Ag—Cu | 3.6 μm | 800° C. | 5 min | ◯ | ◯ |
| Ex. 4 (13b) | Ag—Cu | 3.4 μm | 800° C. | 3 min | ◯ | ◎ |
| Ex. 4 (13c) | Ag—Cu | 3.5 μm | 800° C. | 1 min | ◎ | ◯ |
| Ex. 5 (14a) | Ag—Cu | 1.3 μm | 800° C. | 1 min | Δ | ◯ |
| Ex. 5 (14b) | Ag—Cu | 4.8 μm | 800° C. | 1 min | ◎ | ◯ |
| Ex. 5 (14c) | Ag—Cu | 12.5 μm | 800° C. | 1 min | ◯ | Δ |
| Ex. 6 (15a) | Ag—Cu | 1.2 μm | 820° C. | 5 min | ◯ | |
| Ex. 6 (15b) | Ag—Cu | 1.0 μm | 800° C. | 30 min | ◯ | |
| Ex. 7 (16a) | Ag—Cu | 4.3 μm | 800° C. | 1 min | ◯ | |
| Ex. 7 (16b) | Ag—Cu | 4.5 μm | 800° C. | 1 min | ◯ | |

Comparative Example

A CNT device 17 of Comparative Example is one in which a collector (copper thin film 18) is directly provided on the surface of the CNT layer 2.

Firstly, the Si substrate of which surface had been rubbed with sandpaper was treated with hydrofluoric acid to remove $SiO_2$. Then, a texture of 5 μm to 10 μm was formed by etching for 30 minutes in 2 wt % NaOH/20 vol % isopropyl alcohol aqueous solution at 80° C. Next, Fe by 4 nm and Al by 15 nm were supported on the Si substrate surface by using RF magnetron sputtering.

The Si substrate with the catalyst supported thereon was installed in a cylindrical CVD reaction tube. Under a flow of $H_2$/Ar, it was heated up to 700° C., followed by annealing for 3 minutes. Then, $C_2H_2$ at 0.5 Torr/$H_2$ at 10 Torr/Ar balance ($P_{total}$=76 Torr) was introduced to synthesize CNT for 1 minute at 700° C.

On the CNT grown on the Si substrate, Cu was vapor deposited in vacuo (e.g., $10^{-4}$ Pa) to form the copper thin film 18 on the surface of the CNT layer 2. The CNT device 17 of Comparative Example was manufactured by peeling the copper thin film 18 from the Si substrate.

Figure 19:
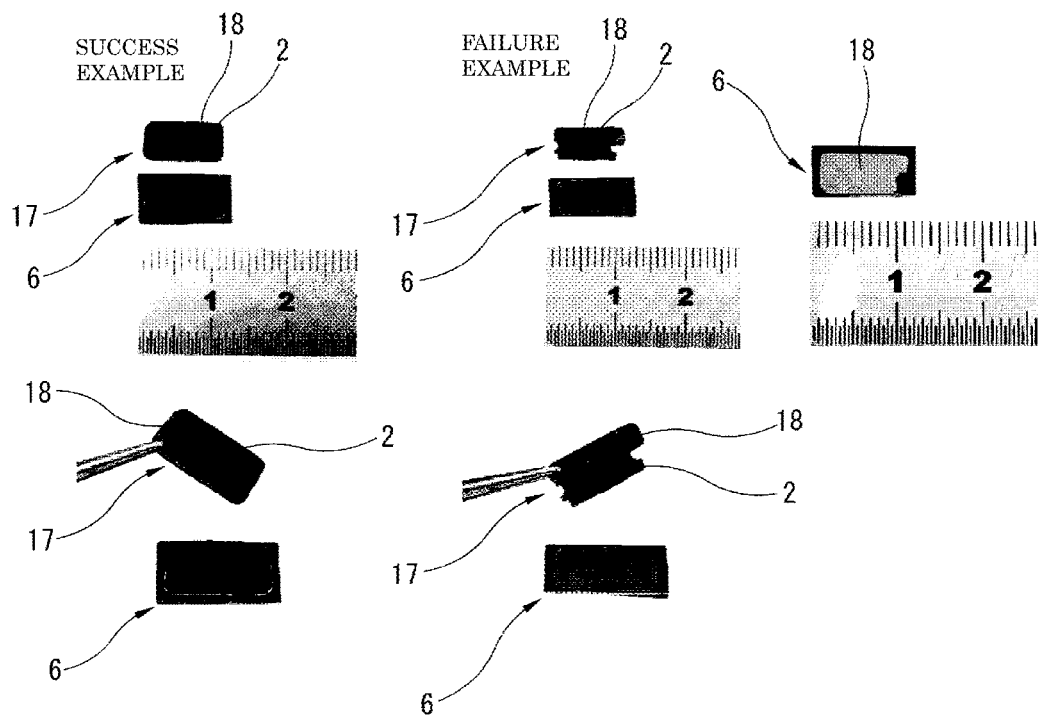
FIG. 19 is a view for explaining CNT devices of Comparative Example.

As shown in FIG. 19, it was possible to manufacture the CNT device 17 by peeling the copper thin film 18 from the Si substrate (heat-resistant textured substrate 6) (see Success Example on the left side of FIG. 19). Since the copper thin film 18 was a thin film of about 10 μm, it was easily broken, and its handling was difficult. Therefore, when peeling the copper thin film 18 from the heat-resistant textured substrate 6, there were a case in which the copper thin film 18 was broken (see the left upper and left lower drawings of Failure Example of FIG. 19), and a case in which the copper thin film 18 was broken to cause no peeling from the heat-resistant textured substrate 6 (see the right upper drawing of Failure Example of FIG. 19).

Reference Example

CNT devices 19*a*, 19*b* of Reference Example are those in which CNT layers 2' are formed on smooth heat-resistant substrates 6'.

Firstly, Fe by 4 nm and Al by 15 nm were supported on the Si substrate surface by using RF magnetron sputtering (STEP 2).

The Si substrate with the catalyst supported thereon was installed in a cylindrical CVD reaction tube. Under a flow of $H_2$/Ar, it was heated up to 700° C., followed by annealing for 10 minutes. Then, $C_2H_2$ at 1.0 Torr/$H_2$ at 10 Torr/Ar balance ($P_{total}$=76 Torr) was introduced to synthesize CNT for 1 minute or 2 minutes at 700° C. (STEP 3). In the CNT device 19*a* prepared by synthesizing CNT for 1 minute, the thickness of the CNT layer 2' was 10 μm. In the CNT device 19*b* prepared by synthesizing CNT for 2 minutes, the thickness of the CNT layer 2' was 63 μm.

On the CNT grown on the Si substrate, Ag and Cu were co-vapor deposited for 30 seconds to form the brazing material layer 3 (Ag—Cu brazing material layer) on the surface of the CNT layer 2' (STEP 4). The formation of the brazing material layer 3 was conducted by preparing a raw material by Ag:Cu=72:28 wt % and in vacuo (e.g., $10^{-4}$ Pa). The thicknesses of the brazing material layers 3 of the CNT devices 19*a*, 19*b* were respectively 3.5 μm and 3.3 μm.

The metal pedestal 4 was provided on the brazing material layer 3, and heating was conducted for 1 minute under conditions of 800° C. and Ar at 10 Torr, thereby brazing the metal pedestal 4 on the CNT layer 2' (STEP 5). After the brazing, the metal pedestal 4 was peeled off the Si substrate to manufacture CNT devices 19*a*, 19*b* of Reference Example (STEP 6).

Figure 20:
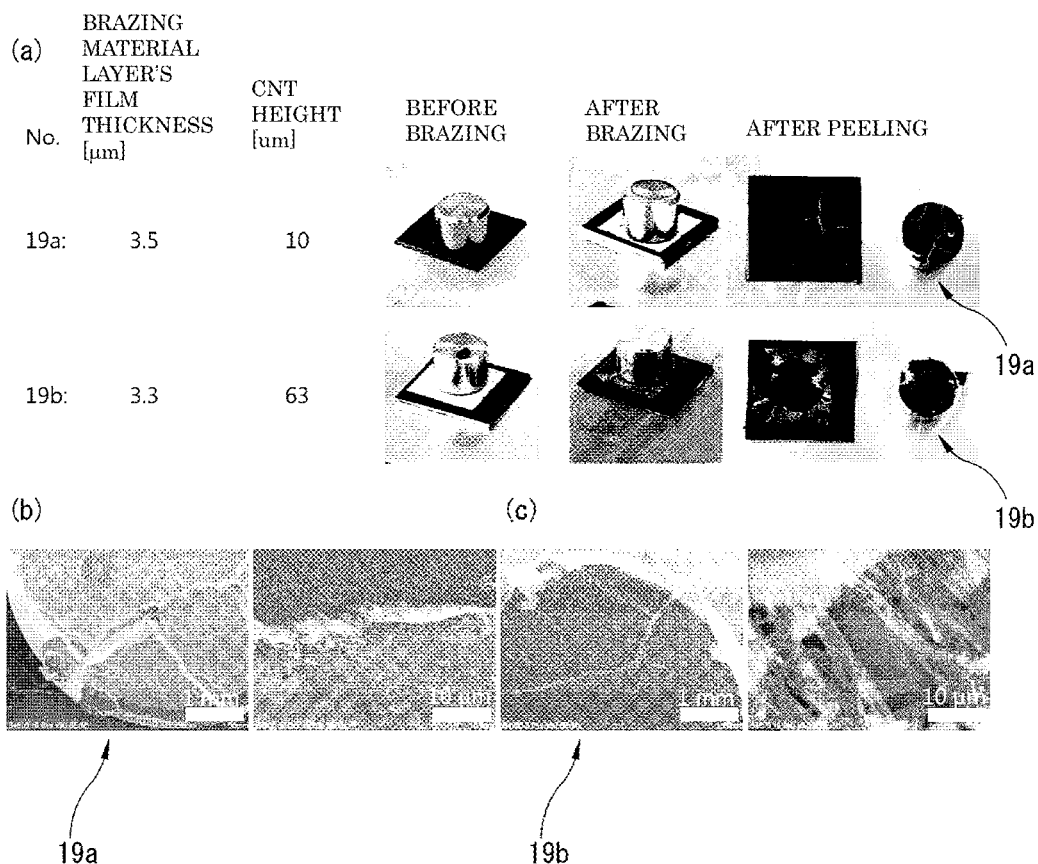
FIG. 20(a) is a view for explaining outlines of CNT devices of Reference Example.
FIG. 20(b) shows SEM images of a CNT layer surface of the CNT device (brazing material layer's thickness: 3.5 μm) of Reference Example.
FIG. 20(c) shows SEM images of a CNT layer surface of the CNT device (brazing material layer's thickness: 3.3 μm) of Reference Example.

As shown in FIG. 20, the CNT devices 19*a*, 19*b* of Reference Example were transferred to the metal pedestals 4. It was, however, difficult to uniformly transfer the CNT layer 2' to the surface of the metal pedestal 4. This is considered because on a smooth heat-resistant substrate 6' the surface of the CNT layer 2' also becomes a smooth surface, the brazing material layer 3 vapor deposited thereon easily peels. Furthermore, the surface of the CNT layer 2' after transferring to the metal pedestal had a flatter surface as compared with the CNT layers 2 of Examples.

Figure 21:
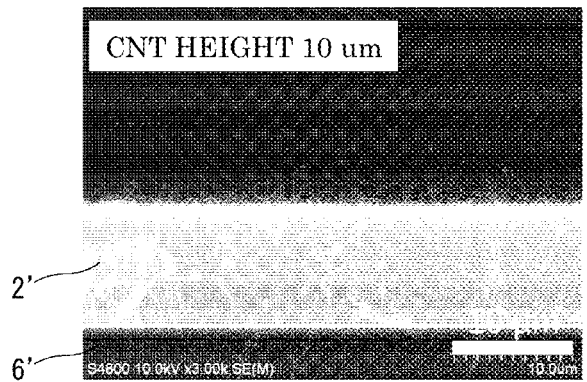
FIG. 21(a) shows enlarged cross-sectional and plane views of the CNT layer of the CNT device (brazing material layer's thickness: 3.5 μm) of Reference Example.
FIG. 21(b) shows enlarged cross-sectional and plane views of the CNT layer of the CNT device (brazing material layer's thickness: 3.3 μm) of Reference Example.
Figure 21:
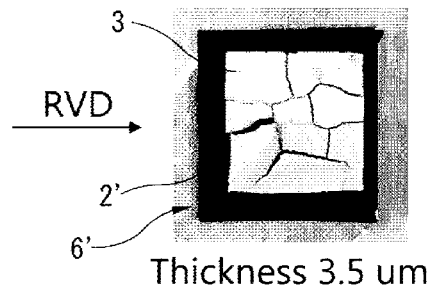
Figure 21:
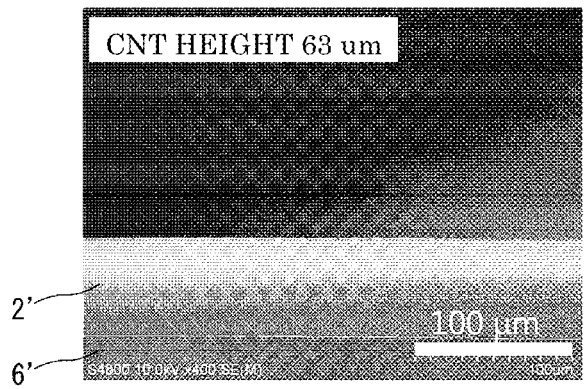
Figure 21:
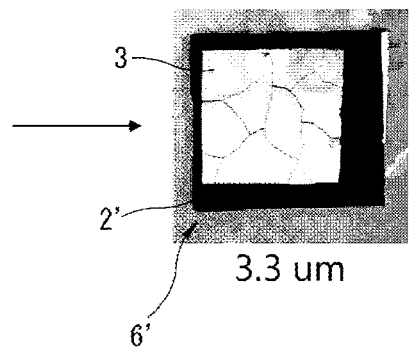

As shown in FIG. 21, the surfaces of the CNT layers 2' formed on the heat-resistant substrates 6' had flatter surfaces as compared with the CNT layers 2 of Examples. Furthermore, cracking was observed on the brazing material layers 3 formed on the CNT layers 2'. This is considered because the surface of the CNT layer 2' is smooth, the brazing material layer 3 easily peels from the CNT layer 2'.

Figure 22:
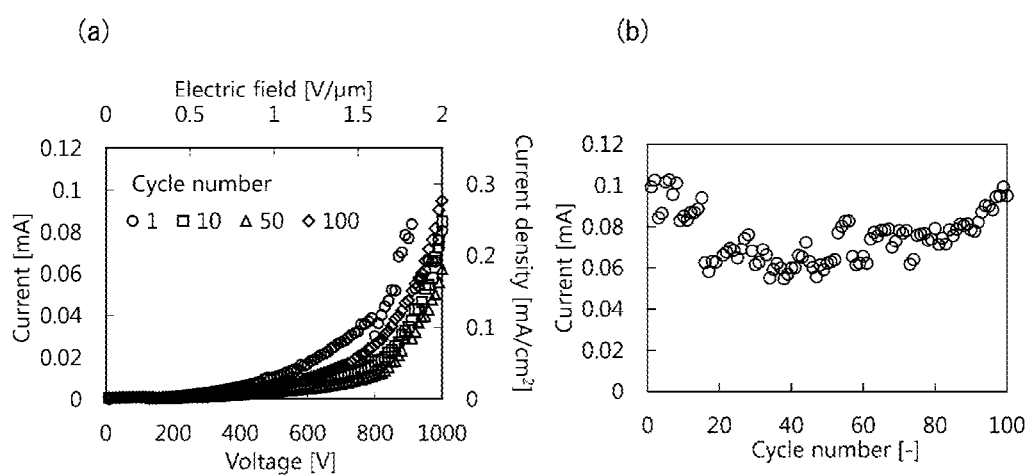
FIG. 22 is a characteristic view showing electrode characteristics (I-V characteristics) of the CNT device (brazing material layer's thickness: 3.5 μm) of Reference Example.

As shown in FIG. 22, the FE performances of the CNT devices 19*a*, 19*b* of Reference Example were lower than those of the CNT devices of Examples by one digit or double digits.

<Another Example of Method for Manufacturing the CNT Device 1>

Figure 23:
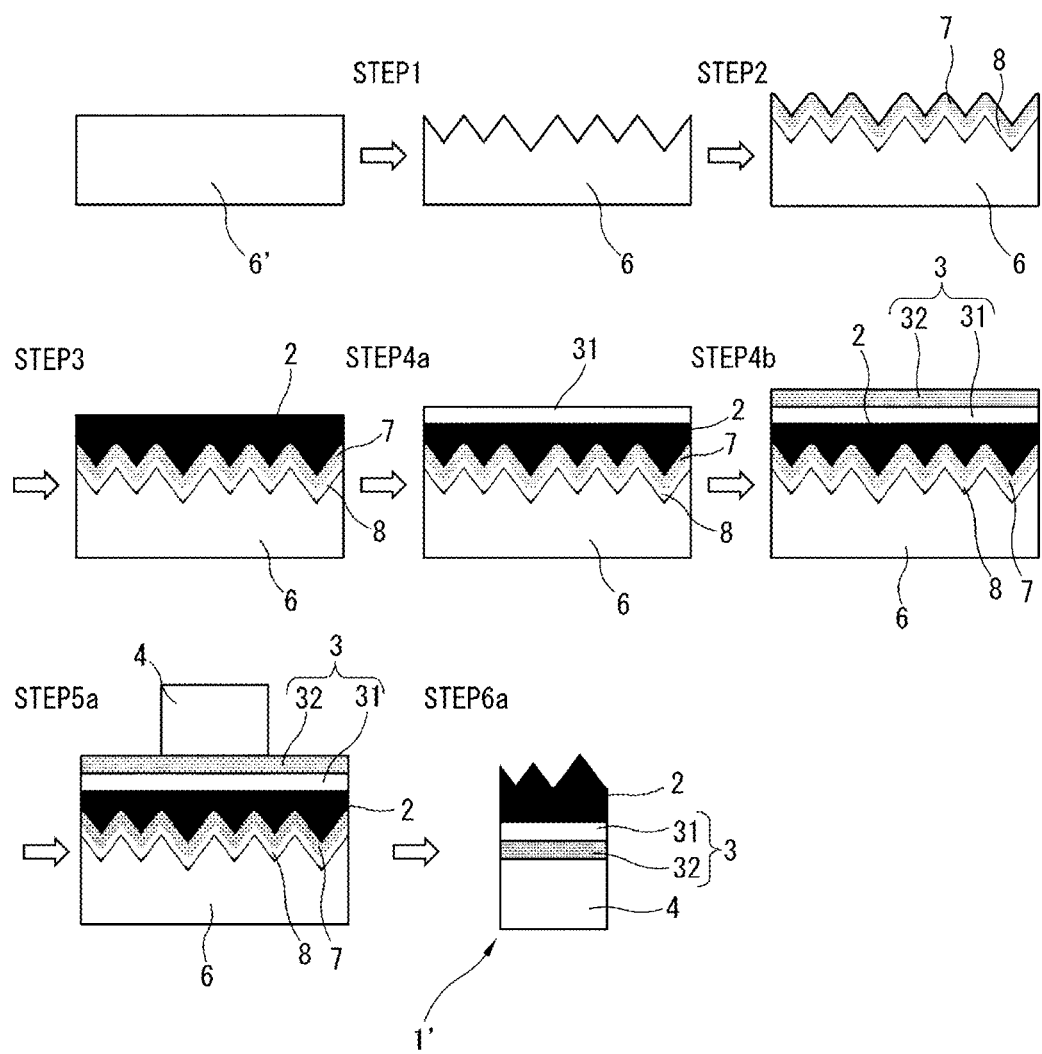
FIG. 23 is an explanatory view for explaining another example of the CNT device manufacturing steps according to an embodiment of the present invention.

Next, with reference to FIG. 23, another example of method for manufacturing the CNT device 1 according to an embodiment of the present invention is explained in detail. As to those similar to FIG. 2, detailed explanations are suitably omitted by citing the same reference signs, etc., and points different from FIG. 2 are mainly explained.

In FIG. 23, after going through STEP 1 to STEP 3 similar to FIG. 2, a first brazing material layer is formed on the CNT layer 2 (STEP 4*a*). Then, a second brazing material layer 32 is formed on the first brazing material layer 31 (STEP 4*b*). This results in constituting a multilayer-structure, brazing material layer 3 having the first brazing material layer 31 formed on the side of the CNT layer 2, and the second brazing material layer 32 formed on the side of the metal pedestal 4.

It is possible to form each of the first and second brazing material layers 31, 32 by suitably applying a method similar to that of the brazing material layer 3 of FIG. 2. Furthermore, in the case of applying brazing materials different in composition to the first and second brazing material layers 31, 32, it is possible to cite applying brazing materials different in melting point. As a specific example, it is possible to cite applying a brazing material of a relatively high melting point (Cu in the after-mentioned Example 8) to the first brazing material layer 31 which is adjacent to the CNT layer 2, and applying a brazing material of a relatively low melting point (Ag—Cu alloy in the after-mentioned Example 8) to the second brazing material layer 32 which is separate from the CNT layer 2.

Next, the metal pedestal 4 is brazed on the CNT layer 2 (STEP 5*a*). The brazing is conducted by heating at a temperature that the brazing material of the second brazing material layer 32 melts. In the second brazing material 32, in the case of using Ag—Cu alloy, since melting point of Ag—Cu alloy is 779° C., it is preferable to conduct the brazing by heating at 779° C. or higher. In the case of using another brazing material, the brazing temperature is adjusted in accordance with melting point of the brazing material.

After brazing the metal pedestal 4 on the CNT layer 2 with the second brazing material layer 32, the heat-resistant substrate 6 is peeled from the CNT layer 2, thereby resulting in CNT device 1'.

The first and second brazing material layers 31, 32 may be formed on the side of the metal pedestal 4. In this case, it is possible to cite forming the second brazing material layer 32 on the metal pedestal 4 and then forming the first brazing material layer 31 on the second brazing material layer 32.

The following Example 8 is one according to CNT device manufactured based on the manufacturing method shown in FIG. 23 and one showing observation results, evaluation results, etc. of the CNT device.

Example 8

Similar to Example 7, CNT device 20 of Example 8 is one prepared by arranging a plurality of metal pedestals 4 on the brazing material layer 3 (the second brazing material layer 32 in Example 8) on the CNT layer 2 and then brazing the CNT layer 2 on the metal pedestals 4.

Firstly, CNT was synthesized on the Si substrate by a method similar to STEP 1 to STEP 3 of Example 1. In the CNT synthesis of STEP 3, $C_2H_2$ at 76 Torr/$H_2$ at 152 Torr/Ar balance ($P_{total}$=760 Torr) was introduced to synthesize CNT for 1 minute at 700° C.

Next, on the CNT grown on the Si substrate, Cu was vapor deposited in vacuo (e.g., $10^{-4}$ Pa) to form the first brazing material layer 31 (Cu brazing material layer) on the surface of the CNT layer 2 (STEP 4a). Then, Ag—Cu alloy (silver solder; BAg-8) was vapor deposited in vacuo (e.g., $10^{-4}$ Pa) on the first brazing material layer 31 to form the second brazing material layer 32 (Ag—Cu brazing material layer) on the surface of the first brazing material layer 31 (STEP 4b). With this, there is provided a condition in which a two-layer structure brazing material layer 3 (that is, Cu brazing material layer and Ag—Cu brazing material layer) is formed on the surface of the CNT layer. The vapor deposition times of the first and second brazing material layers 31, 32 of the CNT device 20 were each 10 seconds, and their thicknesses were each 0.5 μm (the total thickness of the brazing material layer was 1.0 μm).

Next, similar to Example 7, a plurality of metal pedestals 4 were provided on the brazing material layer 3 (the second brazing material layer 32 in Example 8), and the metal pedestals 4 were brazed on the CNT layer 2 by heating for 1 minute under conditions of 800° C. and Ar at 10 Torr (STEP 5a). After brazing, the metal pedestals 4 were peeled off the Si substrate (heat-resistant textured substrate 6), thereby manufacturing the CNT device 20 of Example 8 (STEP 6a).

TABLE 2

| Examples | Brazing Material | Film Thickness | Temp. | Time | Transfer | Performance |
|---|---|---|---|---|---|---|
| Ex. 8 (20) | $1^{st}$ brazing layer 31 | Cu | 0.5 μm | 800° C. | 1 min | ◎ |
| | $2^{nd}$ brazing layer 32 | Ag—Cu | 0.5 μm | 800° C. | 1 min | |

Figure 24:
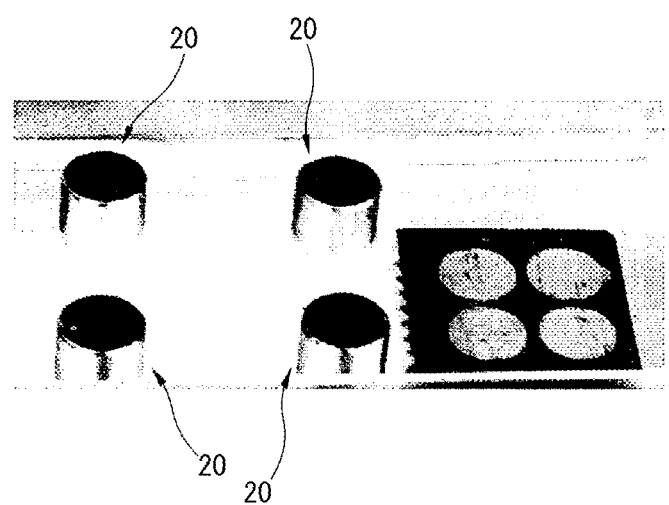
FIG. 24 is a view for explaining an outline of a CNT device of Example 8.

In the CNT device 20, the brazing layer 3 was automatically cut in the shape of the metal pedestal 4, and as shown in FIG. 24 the CNT layer 2 was transferred at the metal pedestal 4 to conform to the shape of the metal pedestal 4. Furthermore, the shape of the brazing material layer 3 on the side of the heat-resistant textured substrate 6 was almost not irregular, and the CNT layer 2 was uniformly transferred to the entire surface of the metal pedestal 4 without spilling out. Leak of the brazing material over the surface of the CNT layer 2 was not confirmed.

As mentioned above, as the reason why leak of the brazing material did not occur, it was found that, since the first brazing material layer 31 of the brazing material layer 3 has a relatively high melting point, the first brazing material layer 31 serves as a barrier layer to suppress an excessive permeation of the brazing material into the CNT layer 2.

According to CNT device 1 and a method for manufacturing CNT device 1 according to an embodiment of the present invention as mentioned above, handling of CNT device 1 becomes easy. That is, a direct provision of the brazing material layer 3 on the CNT layer 2 makes it possible to bond a CNT, which has been formed into a thin film shape, to an arbitrary component by a heat treatment.

By directly forming the brazing material layer 3 on the CNT layer 2, a mixed layer 5 in which the brazing material has permeated into CNT is formed between the CNT layer 2 and the brazing material layer 3. With this, an electrical resistance between the CNT layer 2 and the brazing material layer 3 becomes low, and an adhesion between the CNT layer 2 and the brazing material layer 3 improves. Furthermore, when brazing the brazing material layer 3 and the metal pedestal 4, the brazing material layer 3 melts, and texture of the surface of the brazing material layer 3 which is in contact with the metal pedestal 4 is absorbed. With this, an electric resistance between the brazing material layer 3 and the metal pedestal 4 becomes low, and the bonding also becomes stiff. As a result, electric conductivity and adhesion of the CNT layer 2 and the metal pedestal 4 improve. Therefore, when applying the CNT device 1 to an emitter, scattering of emitter by a high electric field is suppressed.

Furthermore, the use of a metal brazing material for the brazing material layer 3 suppresses a gas release from the brazing material layer 3 even in case that the CNT device 1 is installed in vacuo.

Furthermore, in case that the brazing material layer 3 is formed into a multi-layer structure having the first brazing material layer 31 formed on the side of the CNT layer 2 and the second brazing material layer 32 that is formed on the side of the metal pedestal 4 and has a melting point lower than that of the first brazing material layer 31, an excessive permeation of the brazing material into the CNT layer 2 is suppressed.

Furthermore, it is possible to easily control texture of the surface of the CNT layer 2 of the CNT device 1 by forming the CNT layer 2 on the heat-resistant textured substrate 6. As a result, it is possible to manufacture CNT device 1 that is superior in emitter performance. Furthermore, texture is formed on the surface of the CNT layer 2 on the heat-resistant textured substrate 6 by forming the CNT layer 2 on the heat-resistant textured substrate 6. By providing the brazing material layer 3 on this textured surface, the bonding between the CNT layer 2 and the brazing material layer 3 becomes stiff, and transfer of the CNT layer 2 to the metal pedestal 4 becomes good.

Furthermore, prior to peeling the heat-resistant textured substrate 6 from the CNT layer 2, the metal pedestal 4 is fixed to the CNT layer 2. With this, it is possible to prevent deformation of the CNT layer 2, and handling when incorporating the CNT device 1 into an apparatus becomes easy. As specifically explained, when incorporating an emitter into an X-ray tube, it is possible to easily incorporate an emitter into an X-ray tube by attaching the metal pedestal 4 in an apparatus. Furthermore, in the case of directly providing the copper thin film 18 on the CNT layer 2 (see FIG. 19) like a conventional one, the thickness of the completed device (thickness of the copper thin film 18) is about 10 μm.

When mounting it as an emitter in an X-ray tube, it has been necessary to clamping an end portion of the thin film by another component, etc. As a result, enlargement of a fixing part has been inevitable, and it has been a cause to interfere with the size reduction of X-ray tubes. In contrast with this, a CNT device 1 according to the embodiment of the present invention makes it possible to reduce the size of an apparatus such as X-ray tube by making handling easy (consequently simplifying a fixing part of the CNT device 1).

Furthermore, it is possible to easily manufacture a plurality of CNT devices 1 and remarkably lower the manufacturing cost of the CNT device 1 by brazing a plurality of metal pedestals 4 on the CNT layer 2 formed on the heat-resistant textured substrate 6 with the brazing material layer 3 (for example, see FIG. 17).

Furthermore, in CNT device 1 according to the embodiment of the present invention, it is possible to form a texture, which corresponds to texture of the surface of the heat-resistant textured substrate 6, on the surface of the CNT layer 2. Therefore, it is possible to easily control the shape of texture of the surface of the CNT layer 2. Furthermore, it is possible to lower the manufacturing cost of CNT device 1 by using a reusable mold substrate for the heat-resistant textured substrate 6.

Furthermore, it is possible to form CNT's collector and a CNT layer 2 containing a CNT's collector that is perpendicularly oriented relative to the heat-resistant textured substrate 6 (that is, the surface of the CNT layer 2).

As above, a carbon-metal structure and a method for manufacturing the carbon-metal structure of the present invention was explained by showing specific embodiments. However, a carbon-metal structure and a method for manufacturing the carbon-metal structure of the present invention, and an electron emitter and an X-ray tube which are equipped with a carbon-metal structure according to an embodiment of the present invention are not limited to the embodiment. It is possible to suitably change the design in a range that their characteristics are not impaired. Those resulting from the design change also belong to the technical scope of the present invention.

The invention claimed is:

1. A carbon-metal structure, comprising:
    a carbon film layer containing a fibrous carbon;
    a brazing material layer that is directly provided on the carbon film layer; and
    a metal pedestal that is provided on the carbon film layer with the brazing material layer interposed therebetween,
    wherein the brazing material layer has a multilayer structure having a first brazing material layer that is formed on a side of the carbon film layer and a second brazing material layer that is formed on a side of the metal pedestal and has a melting point lower than that of the first brazing material layer.

2. The carbon-metal structure as claimed in claim 1, wherein the carbon film layer has on a surface thereof a texture having an average height of 1 μm to 100 μm and a height/spacing ratio of 1/5 to 5/1.

3. The carbon-metal structure as claimed in claim 1, wherein the carbon film layer is a layer that is preformed on a substrate, and
    wherein the brazing material layer is a layer formed on an end portion of the carbon film layer that is on a side opposite to a surface in contact with the substrate.

4. The carbon-metal structure as claimed in claim 1, wherein the brazing material layer is a layer formed of a metal brazing material, and
    wherein a mixed layer that is the carbon film layer impregnated with the brazing material that forms the brazing material layer is formed at an interface between the carbon film layer and the brazing material layer.

5. The carbon-metal structure as claimed in claim 1, wherein the brazing material layer has a thickness of from 1 μm to 50 μm.

6. An electron emitter comprising the carbon-metal structure as claimed in claim 1.

7. An X-ray tube comprising the electron emitter as claimed in claim 6.

8. A method for manufacturing a carbon-metal structure, comprising:
    forming on a substrate a carbon film layer containing a fibrous carbon;
    forming a brazing material layer on the carbon film layer formed on the substrate;
    brazing a metal pedestal to the carbon film layer with the brazing material layer interposed therebetween; and
    removing the substrate from the carbon film layer,
    wherein the brazing material layer has a multilayer structure having a first brazing material layer that is formed on a side of the carbon film layer and a second brazing material layer that is formed on a side of the metal pedestal and has a melting point lower than that of the first brazing material layer.

9. The method for manufacturing a carbon-metal structure as claimed in claim 8, wherein the brazing material layer contains a metal brazing material that is vapor-deposited on the carbon film layer.

10. The method for manufacturing a carbon-metal structure as claimed in claim 8, wherein the carbon film layer is formed on the substrate by a chemical vapor deposition.

11. The method for manufacturing a carbon-metal structure as claimed in claim 8, wherein the substrate removed from the carbon film layer is reused as a substrate on which a carbon film layer of another carbon-metal structure is formed.

12. The method for manufacturing a carbon-metal structure as claimed in claim 8, wherein a plurality of metal pedestals are brazed to the carbon film layer with the brazing material layer interposed therebetween.

13. A method for manufacturing a carbon-metal structure, comprising:
    forming on a substrate a carbon film layer containing a fibrous carbon;
    forming a brazing material layer on the carbon film layer formed on the substrate;
    brazing a metal pedestal to the carbon film layer with the brazing material layer interposed therebetween; and
    removing the substrate from the carbon film layer,
    wherein the substrate has on a surface thereof a texture having an average height of 1 μm to 100 μm and a height/spacing ratio of 1/5 to 5/1.

14. The method for manufacturing a carbon-metal structure as claimed in claim 13, wherein the brazing material layer contains a metal brazing material that is vapor-deposited on the carbon film layer.

15. The method for manufacturing a carbon-metal structure as claimed in claim 13, wherein the carbon film layer is formed on the substrate by a chemical vapor deposition.

16. The method for manufacturing a carbon-metal structure as claimed in claim 13, wherein the substrate removed from the carbon film layer is reused as a substrate on which a carbon film layer of another carbon-metal structure is formed.

17. A method for manufacturing a carbon-metal structure, comprising:

forming on a substrate a carbon film layer containing a fibrous carbon;

forming a brazing material layer on a metal pedestal that supports the carbon film layer formed on the substrate;

brazing a metal pedestal to the carbon film layer with the brazing material layer interposed therebetween; and removing the substrate from the carbon film layer, wherein the brazing material layer has a multilayer structure having a first brazing material layer that is formed on a side of the carbon film layer and a second brazing material layer that is formed on a side of the metal pedestal and has a melting point lower than that of the first brazing material layer.

18. The method for manufacturing a carbon-metal structure as claimed in claim 17, wherein the carbon film layer is formed on the substrate by a chemical vapor deposition.

19. The method for manufacturing a carbon-metal structure as claimed in claim 17, wherein the substrate removed from the carbon film layer is reused as a substrate on which a carbon film layer of another carbon-metal structure is formed.

20. The method for manufacturing a carbon-metal structure as claimed in claim 17, wherein a plurality of metal pedestals are brazed to the carbon film layer with the brazing material layer interposed therebetween.

21. A method for manufacturing a carbon-metal structure, comprising:

forming on a substrate a carbon film layer containing a fibrous carbon;

forming a brazing material layer on a metal pedestal that supports the carbon film layer formed on the substrate;

brazing a metal pedestal to the carbon film layer with the brazing material layer interposed therebetween; and removing the substrate from the carbon film layer, wherein the substrate has on a surface thereof a texture having an average height of 1 μm to 100 μm and a height/spacing ratio of 1/5 to 5/1.

* * * * *